(12) United States Patent
Song

(10) Patent No.: US 11,385,298 B2
(45) Date of Patent: *Jul. 12, 2022

(54) APPARATUS AND METHOD FOR DIAGNOSING POSITIVE ELECTRODE CONTACTOR OF BATTERY PACK

(71) Applicant: LG Energy Solution, Ltd., Seoul (KR)

(72) Inventor: Jeong-Joo Song, Daejeon (KR)

(73) Assignee: LG Energy Solution, Ltd.

( * ) Notice: Subject to any disclaimer, the term of this patent is extended or adjusted under 35 U.S.C. 154(b) by 296 days.

This patent is subject to a terminal disclaimer.

(21) Appl. No.: 16/623,655

(22) PCT Filed: Dec. 11, 2018

(86) PCT No.: PCT/KR2018/015726
§ 371 (c)(1),
(2) Date: Dec. 17, 2019

(87) PCT Pub. No.: WO2019/117606
PCT Pub. Date: Jun. 20, 2019

(65) Prior Publication Data
US 2020/0217893 A1  Jul. 9, 2020

(30) Foreign Application Priority Data

Dec. 11, 2017 (KR) .................. 10-2017-0169401

(51) Int. Cl.
*G01R 31/52* (2020.01)
*G01R 31/382* (2019.01)
(Continued)

(52) U.S. Cl.
CPC ............. *G01R 31/52* (2020.01); *G01R 15/04* (2013.01); *G01R 31/3274* (2013.01);
(Continued)

(58) Field of Classification Search
CPC ........ G01R 15/04; G01R 31/36; G01R 31/52; G01R 31/382; G01R 31/3835;
(Continued)

(56) References Cited

U.S. PATENT DOCUMENTS 7,486,049 B2 * 2/2009 Wan ...................... H02J 7/0031
320/134
7,531,988 B2 * 5/2009 Sato ...................... H02J 7/0031
320/134

(Continued)

FOREIGN PATENT DOCUMENTS

CN 102269790 A 12/2011
CN 102830351 A 12/2012
(Continued)

OTHER PUBLICATIONS

Extended European Search Report including Written Opinion for Application No. EP18888367.2, dated Jul. 17, 2020, pp. 1-6.
(Continued)

*Primary Examiner* — Helen Rossoshek
(74) *Attorney, Agent, or Firm* — Lerner, David, Littenberg, Krumholz & Mentlik, LLP

(57) ABSTRACT

An apparatus and method for diagnosing a short circuit accident occurring at a positive electrode contactor of a battery pack. This apparatus diagnoses a positive electrode contactor of a battery pack, which includes a positive electrode contactor provided on a charge-discharge path connected to a positive electrode terminal and a negative electrode contactor provided on a charge-discharge path connected to a negative electrode terminal.

10 Claims, 13 Drawing Sheets

(51) Int. Cl.
*G01R 15/04* (2006.01)
*G01R 31/327* (2006.01)
*H01M 10/42* (2006.01)
*H01M 10/48* (2006.01)

(52) U.S. Cl.
CPC ........ *G01R 31/382* (2019.01); *H01M 10/425* (2013.01); *H01M 10/48* (2013.01)

(58) Field of Classification Search
CPC .............. G01R 31/327; G01R 31/3274; G01R 31/3277; H01M 10/4264; H01M 10/425; H01M 10/48; H01M 10/4207; H01M 10/482; H01M 2010/4271; H01M 2220/30; H02J 7/0013; H02J 7/0047; Y02E 60/10
See application file for complete search history.

(56) References Cited

U.S. PATENT DOCUMENTS

| | | | |
|---|---|---|---|
| 11,125,824 B2 * | 9/2021 | Lee | H02J 13/00022 |
| 11,169,210 B2 * | 11/2021 | Song | H01M 10/4264 |
| 2002/0070608 A1 | 6/2002 | Matsuki et al. | |
| 2006/0208850 A1 * | 9/2006 | Ikeuchi | H02J 7/0031 |
| | | | 340/5.8 |
| 2007/0139005 A1 | 6/2007 | Osawa | |
| 2007/0221627 A1 | 9/2007 | Yugou et al. | |
| 2011/0156636 A1 * | 6/2011 | Kim | H02J 7/02 |
| | | | 320/108 |
| 2014/0028322 A1 | 1/2014 | Tzivanopoulos | |
| 2014/0084933 A1 | 3/2014 | Jang et al. | |
| 2014/0095093 A1 | 4/2014 | Hong et al. | |
| 2016/0056444 A1 * | 2/2016 | Hwang | H02J 7/0029 |
| | | | 429/7 |
| 2016/0154064 A1 | 6/2016 | Klein et al. | |
| 2020/0153264 A1 * | 5/2020 | Osada | B60L 58/16 |

FOREIGN PATENT DOCUMENTS

| | | |
|---|---|---|
| CN | 102866353 A | 1/2013 |
| CN | 103576046 A | 2/2014 |
| CN | 103688183 A | 3/2014 |
| CN | 104220886 A | 12/2014 |
| CN | 105137336 A | 12/2015 |
| CN | 105652190 A | 6/2016 |
| CN | 106814311 A | 6/2017 |
| JP | 2003102101 A | 4/2003 |
| JP | 2007165253 A | 6/2007 |
| JP | 2007258109 A | 10/2007 |
| JP | 200858085 A | 3/2008 |
| JP | 1989205 B2 | 8/2012 |
| JP | 2013233861 A | 11/2013 |
| JP | 5450144 B2 | 3/2014 |
| JP | 2016170931 A | 9/2016 |
| KR | 20110062136 A | 6/2011 |
| KR | 20130127828 A | 11/2013 |
| KR | 20150064623 A | 6/2015 |
| KR | 20160069800 A | 6/2016 |
| KR | 101716886 B1 | 3/2017 |
| KR | 20170097481 A | 8/2017 |

OTHER PUBLICATIONS

Chinese Search Report for Application No. 201880041399.4, dated May 25, 2021, 3 pages.
International Search Report for Application No. PCT/KR2018/015726, dated Mar. 20, 2019, pp. 1-2.

* cited by examiner

APPARATUS AND METHOD FOR DIAGNOSING POSITIVE ELECTRODE CONTACTOR OF BATTERY PACK

CROSS-REFERENCE TO RELATED APPLICATIONS

This application is a national phase entry under 35 U.S.C. § 371 of International Application No. PCT/KR2018/015726, filed Dec. 11, 2018, which claims priority to Korean Patent Application No. 10-2017-0169401, filed Dec. 11, 2017, the disclosures of which are incorporated herein by reference.

TECHNICAL FIELD

The present disclosure relates to an apparatus and method for diagnosing a positive electrode contactor of a battery pack, and more particularly, to an apparatus and method for diagnosing a short circuit accident occurring at a positive electrode contactor of a battery pack.

BACKGROUND ART

Recently, the demand for portable electronic products such as notebook computers, video cameras and portable telephones has increased sharply, and energy storage batteries, robots, satellites and the like have been developed in earnest. Accordingly, high-performance secondary batteries allowing repeated charging and discharging are being actively studied.

Accordingly, as technology development and demand for mobile devices, electric vehicles, hybrid electric vehicles, power storage systems and uninterruptible power supplies are increasing, the demand for secondary batteries as energy sources is rapidly increasing. In particular, the secondary battery used for the electric vehicle or the hybrid electric vehicle is a high-power large-capacity secondary battery and is being intensively studied.

In addition, along with a great deal of demand for secondary batteries, peripheral components and devices related to secondary batteries are being studied together. That is, various parts and devices such as a battery module prepared by connecting a plurality of secondary batteries, a battery management system (BMS) for controlling the charge and discharge of the battery module and monitoring the state of each secondary battery, a battery pack prepared by packing the battery module and the BMS, and a contactor for connecting the battery module to a load such as a motor are being studied.

In particular, the contactor is a switch that connects the battery module and the load and controls the power supply. For example, the working voltage of a lithium ion secondary battery widely used in the art is about 3.7V to 4.2V. In order to provide a high voltage, a plurality of secondary batteries are connected in series to form a battery module. In the case of the battery module used in an electric vehicle or a hybrid electric vehicle, the motor for driving the vehicle require a battery voltage of about 240V to 280V. Here, a high voltage high-power electrical energy always passes through the contactor that connects the battery module and the motor, and it is very important to monitor whether the contactor has a fault.

Meanwhile, various devices requiring electric energy such as an electric vehicle essentially includes a power system. The power system selectively opens and closes at least one contactor to stably supply power between the battery and the load.

In relation to the safety of the power system, it is necessary to diagnose two types of accidents. One is the electric leakage accident of the battery, and the other is the short circuit accident of the contactor. If the electric leakage occurs, the user may be electrically shocked. If the short circuit occurs, there is a risk of sudden unintended acceleration.

Although the technique for diagnosing an electric leakage accident and the technique for diagnosing a short circuit accident have been disclosed in the prior art individually, but there is no prior art for simultaneously diagnosing both types of accidents.

If the electric leakage accident and the short circuit accident are not diagnosed simultaneously, serious safety issues may be caused. For example, if the diagnosis of the short circuit accident is initiated only after the electric leakage accident is completely diagnosed, it is not possible to promptly notify the occurrence of the short circuit accident to the user.

Further, even when the short circuit accident of the contactor is diagnosed, it is required to accurately diagnose a specific contactor in which the short circuit accident occurs, among a plurality of contactors. For example, if the battery pack has a positive electrode contactor and a negative electrode contactor and a short circuit accident occurs in the positive electrode contactor, it is required to accurately determine that a short circuit accident occurs at the positive electrode contactor and exactly notify the diagnosis result to the user.

SUMMARY

Technical Problem

The present disclosure is designed to solve the problems of the related art, and therefore the present disclosure is directed to providing an apparatus and method for diagnosing a positive electrode contactor of a battery pack, which may determine whether a short circuit occurs at a positive electrode contactor while performing a function of determining whether an electric leakage occurs at the battery module.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a positive electrode contactor of a battery pack, wherein the battery pack includes the positive electrode contactor provided on a first charge-discharge path connected to a positive electrode terminal of the battery pack and a negative electrode contactor provided on a second charge-discharge path connected to a negative electrode terminal of the battery pack, the apparatus configured to: measure a first measurement voltage applied between a ground and a first node to which a positive electrode terminal of a battery module included in the battery pack and a first end of the positive electrode contactor are commonly connected; and measure a second measurement voltage applied between the ground and a second node to which a negative electrode terminal of the battery module and a first end of the negative electrode contactor are commonly connected. The apparatus comprises a positive electrode protection capacitor located between the ground and the positive electrode terminal of the battery pack; a negative electrode protection capacitor located between the ground and the negative electrode terminal of the battery pack; and a processor coupled to a plurality of diagnosis circuits configured to selectively connect two points among the first node, the second node, a third node to which a second end of the positive electrode contactor and a first end of the positive electrode protection capacitor are commonly connected, a fourth node to which a second end of the negative electrode contactor and a first end of the negative electrode protection capacitor are commonly connected, and the ground. The processor is configured to measure a first diagnosis voltage applied between the third node and the second node, measure a second diagnosis voltage applied to the positive electrode protection capacitor, and measure a third diagnosis voltage applied to the negative electrode protection capacitor. The processor is configured to diagnose whether the battery module is electrically leaky based on the first measurement voltage and the second measurement voltage. The processor is configured to diagnose whether the positive electrode contactor is short-circuited based on at least one of the first diagnosis voltage, the second diagnosis voltage or the third diagnosis voltage.

In addition, the plurality of diagnosis circuits may include a first diagnosis circuit connected between the third node and the second node and configured to measure the first diagnosis voltage between the third node and the second node; a second diagnosis circuit connected between the third node and the ground and configured to measure the second diagnosis voltage between the third node and the ground; and a third diagnosis circuit connected between the fourth node and the ground and configured to measure the third diagnosis voltage between the fourth node and the ground.

In addition, the first diagnosis circuit may include a first voltage dividing circuit having a first protection resistor and a first detection resistor to divide the first diagnosis voltage and a first switch for applying a voltage to the first voltage dividing circuit in response to a first control signal output from the processor, the second diagnosis circuit may include a second voltage dividing circuit having a second protection resistor and a second detection resistor to divide the second diagnosis voltage and a second switch for applying a voltage to the second voltage dividing circuit in response to a second control signal output from the processor, and the third diagnosis circuit may include a third voltage dividing circuit having a third protection resistor and a third detection resistor to divide the third diagnosis voltage and a third switch for applying a voltage to the third voltage dividing circuit in response to a third control signal output from the processor.

In addition, the first voltage measuring unit may include a fourth voltage dividing circuit having a fourth protection resistor and a fourth detection resistor to divide the first measurement voltage and a fourth switch for applying a voltage to the fourth voltage dividing circuit in response to a fourth control signal output from the processor, and the second voltage measuring unit may include a fifth voltage dividing circuit having a fifth protection resistor and a fifth detection resistor to divide the second measurement voltage and a fifth switch for applying a voltage to the fifth voltage dividing circuit in response to a fifth control signal output from the processor.

In addition, the processor may be configured to control the fourth switch and the first switch into a closed state during a first switching cycle. The processor may be configured to control the fifth switch into an open state during the first switching cycle. The processor may be configured to control the fourth switch into an open state during a second switching cycle. The processor may be configured to control the fifth switch and the first switch into a closed state during the second switching cycle. The processor may be configured to measure the first diagnosis voltage, the second diagnosis voltage and the third diagnosis voltage during each of the first switching cycle and the second switching cycle.

In addition, the processor may be configured to determine that the positive electrode contactor is in a normal state without a short circuit when the first diagnosis voltage has a positive value during the first switching cycle, an absolute value of the first diagnosis voltage gradually decreases during the first switching cycle, the first diagnosis voltage has a negative value during the second switching cycle, and an absolute value of the first diagnosis voltage gradually decreases during the second switching cycle.

In addition, the processor may be configured to determine that the positive electrode contactor is in a fault state with a short circuit when the first diagnosis voltage has a positive value and is kept constantly during each of the first switching cycle and the second switching cycle.

In addition, the processor may be configured to determine that the positive electrode contactor is in the fault state with the short circuit when the second diagnosis voltage has a value of 0 or more and when a difference between a voltage value of the second diagnosis voltage and a voltage value of the third diagnosis voltage gradually decreases during each of first switching cycle and the second switching cycle.

In another aspect of the present disclosure, there is also provided a battery pack, comprising the apparatus for diagnosing a positive electrode contactor of a battery pack according to any of the embodiments described in the present disclosure.

In another aspect of the present disclosure, there is also provided a method for diagnosing a positive electrode contactor of a battery pack, wherein the battery pack includes the positive electrode contactor provided on a first charge-discharge path connected to a positive electrode terminal of the battery pack and a negative electrode contactor provided on a second charge-discharge path connected to a negative electrode terminal of the battery pack, the method comprising: measuring a first measurement voltage applied between a ground and a first node to which a positive electrode terminal of a battery module included in the battery pack and a first end of the positive electrode contactor are commonly connected, measuring a second measurement voltage applied between the ground and a second node to which a negative electrode terminal of the battery module and a first end of the negative electrode contactor are commonly connected; measuring a first diagnosis voltage applied between the second node and a third node to which a second end of the positive electrode contactor and a first end of a positive electrode protection capacitor are commonly connected, measuring a second diagnosis voltage applied to the positive electrode protection capacitor located between the ground and the positive electrode terminal of the battery pack, measuring a third diagnosis voltage applied to a negative electrode protection capacitor located between the ground and the negative electrode terminal of the battery pack; and diagnosing whether the battery module is electrically leaky based on the first measurement voltage and the second measurement voltage, and diagnosing whether the positive electrode contactor is short-circuited based on at least one of the first diagnosis voltage, the second diagnosis voltage or the third diagnosis voltage.

Advantageous Effects

According to at least one of embodiments of the present disclosure, it is possible to perform a function of determining whether a short circuit occurs at a positive electrode contactor while performing a function of determining whether an electric leakage occurs at the battery module. Thus, it is possible to more promptly notify the information about the occurrence of a short circuit accident to the user.

The present disclosure may have various effects other than the above, and other effects of the present disclosure may be understood from the following description and more clearly figured out by the embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
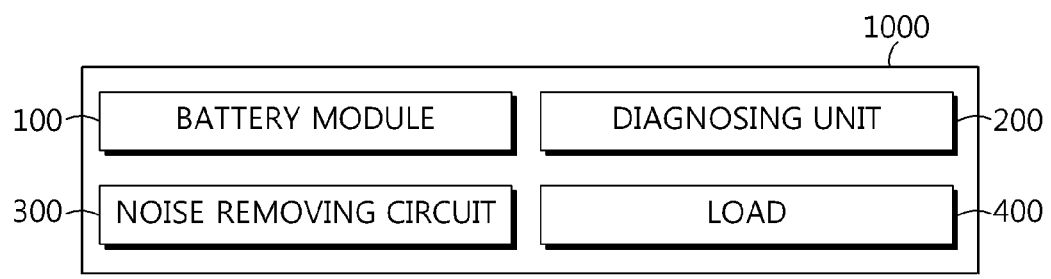
FIG. 1 is a diagram schematically showing a functional configuration of a power system, which includes an apparatus for diagnosing a positive electrode contactor of a battery pack according to an embodiment of the present disclosure.

FIG. 1 is a diagram schematically showing a functional configuration of a power system, which includes an apparatus for diagnosing a positive electrode contactor of a battery pack according to an embodiment of the present disclosure.

Referring to FIG. 1, a power system 1000 may be provided at a device capable of storing and supplying electric energy such as an electric vehicle. Here, the power system 1000 may also be provided at a small-scale power storage system such as a smart phone or a large-scale strategic storage system such as an energy storage system, in addition to an electric vehicle.

The power system 1000 may include a battery module 100, a diagnosing unit 200, a noise removing circuit 300, and a load 400.

The battery module 100 may include at least one secondary battery. If a plurality of secondary batteries are included in the battery module 100, any one of the plurality of secondary batteries may be connected to another secondary battery in series or in parallel. The secondary batteries included in the battery module 100 may be lithium ion batteries, lithium polymer batteries, nickel cadmium batteries, nickel hydrogen batteries, nickel-zinc batteries or the like. Here, the kind of secondary battery is not limited to the above and is not particularly limited as long as the secondary battery is capable of repeating charge and discharge.

The load 400 may convert the electrical energy provided from the battery module 100 into another type of energy. For example, load 400 may include an electric motor. In this case, the load 400 may convert the electric energy provided from the battery module 100 into a rotational energy. Accordingly, if the battery module 100 is provided in an electric vehicle, wheels and/or cooling fans provided at the electric vehicle may be rotated. As another example, the load 400 may include a resistor. In this case, the load 400 may convert the electric energy provided from the battery module 100 into a thermal energy.

The noise removing circuit 300 may be connected between the battery module 100 and the load 400 to remove noise transmitted from any one of the battery module 100 and the load 400 to the other.

The diagnosing unit 200 is connected between the battery module 100 and the load 400 to diagnose whether a predetermined type of accident occurs. For example, the diagnosing unit 200 may be configured to determine whether an electric leakage occurs at the battery module 100. In addition, the diagnosing unit 200 may determine whether a contactor installed on a power supply path between the battery module 100 and the load 400 has a fault. In addition, the diagnosing unit 200 may control the power supply between the battery module 100 and the load 400 by controlling the opening and closing of the contactor.

Figure 2:
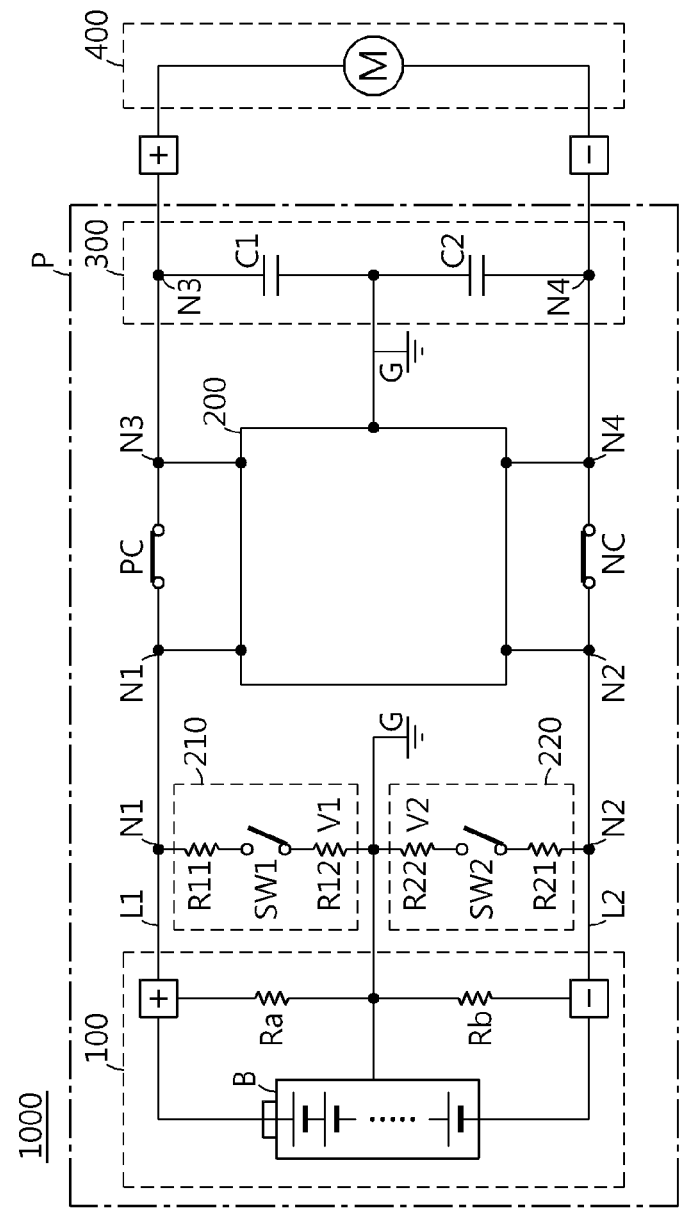
FIG. 2 is a circuit diagram schematically showing a configuration of the apparatus for diagnosing a positive electrode contactor of a battery pack according to an embodiment of the present disclosure.

FIG. 2 is a circuit diagram schematically showing a configuration of the apparatus for diagnosing a positive electrode contactor of a battery pack according to an embodiment of the present disclosure.

Referring to FIG. 2, the power system 1000 may include a battery pack P and a load 400. The battery pack P may include a plurality of contactors. Each of the plurality of contactors is connected to one end or other end of the battery module 100 that includes at least one secondary battery. Specifically, the battery pack P may include a positive electrode contactor PC and a negative electrode contactor NC. Also, the battery pack P may have a charge-discharge path for connecting both ends of the battery module 100 and the plurality of contactors PC, NC. For example, as shown in FIG. 2, the positive electrode contactor PC may be provided on a first charge-discharge path L1 connected to a positive electrode terminal of the battery pack P. Also, the negative electrode contactor NC may be provided on a second charge-discharge path L2 connected to a negative electrode terminal of the battery pack P.

The battery module 100 may include a battery assembly B having at least one secondary battery and an insulation resistor. In particular, the battery module 100 may include a first insulation resistor Ra and a second insulation resistor Rb. Here, the first insulation resistor Ra and the second insulation resistor Rb may refer to a virtual resistor indicating the insulation state of each of the positive electrode and the negative electrode of the battery assembly B, rather than a physical resistor intentionally installed at the time of manufacturing the battery module 100.

For example, as shown in FIG. 2, the first insulation resistor Ra may be provided to be connected between the ground G and the positive electrode terminal of the battery module 100 at which the highest potential of the battery assembly B is formed. Also, the second insulation resistor Rb may be provided to be connected between the ground G and the negative electrode terminal of the battery module 100 at which the lowest potential of the battery assembly B is formed. For example, if a power system 1000 is provided to a vehicle, the ground G may be a chassis of the vehicle.

The electrical energy stored in the battery assembly B may be supplied to the load 400 connected to the positive electrode terminal of the battery pack P and the negative electrode terminal of the battery pack P. To this end, the positive electrode terminal of the battery assembly B may be electrically connected to the positive electrode terminal of battery pack P via the first charge-discharge path L1. Also, the negative electrode terminal of battery assembly B may be electrically connected to the negative electrode terminal of the battery pack P through the second charge-discharge path L2. In this case, the power supply path through the first charge-discharge path L1 may be selectively opened and closed by the positive electrode contactor PC, and the power supply path through the second charge-discharge path L2 may be selectively opened and closed by the negative electrode contactor NC.

The apparatus for diagnosing the positive electrode contactor of the battery pack P according to the present disclosure may include a first voltage measuring unit 210, a second voltage measuring unit 220, a positive electrode protection capacitor C1, a negative electrode protection capacitor C2 and a diagnosing unit 200.

The first voltage measuring unit 210 may be connected between a first node N1 and the ground G. For example, as shown in FIG. 2, the first voltage measuring unit 210 may be connected between the ground G and the first node N1 to which the positive electrode terminal of the battery module 100 included in the battery pack P and one end of the positive electrode contactor PC are commonly connected. In particular, the first voltage measuring unit 210 may be provided to measure a first measurement voltage applied between the first node N1 and the ground G.

Specifically, the first voltage measuring unit 210 may include a first voltage dividing circuit and a first switch SW1. In particular, the first voltage dividing circuit and the first switch SW1 may be connected to each other in series. In detail, the first voltage dividing circuit may include a first protection resistor R11 and a first detection resistor R12. Here, the first protection resistor R11 and the first detection resistor R12 may divide the first measurement voltage applied between the first node N1 and the ground G. For example, if the resistance of the first protection resistor R11 is 99 times the resistance of the first detection resistor R12, the first measurement voltage may be divided at a ratio of 1:99.

For example, as shown in FIG. 2, one end of the first protection resistor R11 may be connected to the first node N1, and one end of the first detection resistor R12 may be connected to the ground G. Also, the other end of the first protection resistor R11 and the other end of the first detection resistor R12 may be connected to one end and the other end of the first switch SW1, respectively. Even though FIG. 2 depicts that the first switch SW1 is connected between the first protection resistor R11 and the first detection resistor R12, the connection of these components is not limited thereto.

Also, a first detection voltage V1 may be applied across the first detection resistor R12. At this time, the first measurement voltage may be calculated from the first detection voltage V1. For example, if the resistance of the first protection resistor R11 is 99 times the resistance of the first detection resistor R12, the first measurement voltage may be calculated to be 100 times the first detection voltage V1.

The first switch SW1 may apply the first measurement voltage to the first voltage dividing circuit. In particular, the first switch SW1 may apply the first measurement voltage to the first voltage dividing circuit in response to a control signal output from the diagnosing unit 200. For example, the first measurement voltage may be divided by the first voltage dividing circuit when the first switch SW1 is in a closed state.

The second voltage measuring unit 220 may be connected between a second node N2 and the ground G. For example, as shown in FIG. 2, the second voltage measuring unit 220 may be connected between the ground G and the second node N2 to which the negative electrode terminal of the battery module 100 included in the battery pack P and one end of the negative electrode contactor NC are commonly connected. In particular, the second voltage measuring unit 220 may be provided to measure a second measurement voltage applied between the second node N2 and the ground G.

Specifically, the second voltage measuring unit 220 may include a second voltage dividing circuit and a second switch SW2. In particular, the second voltage dividing circuit and the second switch SW2 may be connected in series with each other. Specifically, the second voltage dividing circuit may include a second protection resistor R21 and a second detection resistor R22. Here, the second protection resistor R21 and the second detection resistor R22 may divide the second measurement voltage applied between the second node N2 and the ground G. For example, if the resistance of the second protection resistor R21 is 99 times the resistance of the second detection resistor R22, the second measurement voltage may be divided in a ratio of 1:99.

For example, as shown in FIG. 2, one end of the second protection resistor R21 may be connected to the second node N2, and one end of the second detection resistor R22 may be connected to the ground G. Also, the other end of the second protection resistor R21 and the other end of the second detection resistor R22 may be connected to one end and the other end of the second switch SW2, respectively. Even though FIG. 2 shows that the second switch SW2 is connected between the second protection resistor R21 and the second detection resistor R22, the present disclosure is not limited to the above connection order.

Also, a second detection voltage V2 may be applied across the second detection resistor R22. At this time, the second measurement voltage may be calculated from the second detection voltage V2. For example, if the resistance of the second protection resistor R21 is 99 times the resistance of the second detection resistor R22, the second measurement voltage may be calculated to be 100 times the second detection voltage V2.

The second switch SW2 may apply the second measurement voltage to the second voltage dividing circuit. In particular, the second switch SW2 may apply the second measurement voltage to the second voltage dividing circuit in response to a control signal output from the diagnosing unit 200. For example, the second measurement voltage may be divided by the second voltage dividing circuit when the second switch SW2 is in the closed state.

Preferably, the ratio between the resistance of the first protection resistor R11 and the resistance of the first detection resistor R12 may be designed to be equal to the ratio between the resistance of the second protection resistor R21 and the resistance of the second detection resistor R22. For example, the resistance of the first protection resistor R11 and the resistance of the second protection resistor R21 may be equal to each other, and the resistance of the first detection resistor R12 and the resistance of the second detection resistor R22 may be equal to each other. At this time, in order to protect the first detection resistor R12 and the second detection resistor R22 from a high voltage, the resistance of the first protection resistor R11 and the second protection resistor R21 may be designed to be sufficiently larger than the resistance of the first detection resistor R12 and the second detection resistor R22, respectively. For example, the resistance of the first protection resistor R11 may be 99 times the resistance of the first detection resistor R12.

The noise removing circuit 300 may include a positive electrode protection capacitor C1 and a negative electrode protection capacitor C2. The positive electrode protection capacitor C1 may be located between the positive electrode terminal of the battery pack P and the ground G. Also, the negative electrode protection capacitor C2 may be located between the negative electrode terminal of the battery pack P and the ground G.

In particular, the positive electrode protection capacitor C1 and the negative electrode protection capacitor C2 may be connected in series between the positive electrode terminal of the battery pack P and the negative electrode terminal of the battery pack P. In addition, one end of the positive electrode protection capacitor C1 and one end of the negative electrode protection capacitor C2 may be commonly connected to the ground G. At this time, the positive electrode protection capacitor C1 and the negative electrode protection capacitor C2 may be referred to as 'Y-CAP'.

The diagnosing unit 200 may control the switches SW1, SW2 respectively provided at the first voltage measuring unit 210 and the second voltage measuring unit 220. That is, the diagnosing unit 200 may control the first switch SW1 and the second switch SW2 provided respectively at the first voltage measuring unit 210 and the second voltage measuring unit 220 to turn on or turn off. With this configuration, the diagnosing unit 200 may determine whether or not the battery module 100 is electrically leaky. That is, the diagnosing unit 200 may determine whether the battery module 100 is electrically leaky, by selectively turning on and off the first switch SW1 and the second switch SW2 provided at the first voltage measuring unit 210 and the second voltage measuring unit 220, respectively. Determining an electric leakage of the battery module 100 will be described later in more detail with reference to FIGS. 5 and 6.

The diagnosing unit 200 may include a plurality of diagnosis circuits. In particular, the plurality of diagnosis circuits may be configured to selectively connect two of the first node N1, the second node N2, the third node N3, the fourth node N4, and the ground G. Here, the first node N1 is a node to which the positive electrode terminal of the battery module 100 and one end of the positive electrode contactor PC are connected in common. Also, the second node N2 is a node to which the negative electrode terminal of the battery module 100 and one end of the negative electrode contactor NC are connected in common. Also, the third node N3 is a node to which the other end of the positive electrode contactor PC and one end of the positive electrode protection capacitor C1 are connected in common. Also, the fourth node N4 is a node to which the other end of the negative electrode contactor NC and one end of the negative electrode protection capacitor C2 are connected in common.

The diagnosing unit 200 may select two combinable points among the first node N1, the second node N2, the third node N3, the fourth node N4 and the ground G, and measure the voltage applied between the selected two points. For example, the diagnosing unit 200 may measure a voltage between the first node N1 and the second node N2. Here, the voltage applied between the first node N1 and the second node N2 is a voltage across the battery module 100. In another example, the diagnosing unit 200 may measure the voltage between the third node N3 and the second node N2. Here, the voltage applied between the third node N3 and the second node N2 is a first diagnosis voltage. In still another example, the diagnosing unit 200 may measure the voltage between the third node N3 and the ground G. Here, the voltage applied between the third node N3 and the ground G is a second diagnosis voltage applied to the positive electrode protection capacitor C1. In further another example, the diagnosing unit 200 may measure the voltage between the fourth node N4 and the ground G. Here, the voltage applied between the fourth node N4 and the ground G is a third diagnosis voltage applied to the negative electrode protection capacitor C2.

The diagnosing unit 200 may determine whether the battery module 100 is electrically leaky and whether the positive electrode contactor PC is short-circuited sequentially or simultaneously, based on the voltage associated with at least one of the first node N1, the second node N2, the third node N3 and the fourth node N4. In particular, the diagnosing unit 200 may diagnose the electric leakage of the battery module 100 by using the first measurement voltage and the second measurement voltage. Also, the diagnosing unit 200 may diagnose the short circuit of the positive electrode contactor PC by using the first measurement voltage, the second measurement voltage, the first diagnosis voltage, the second diagnosis voltage and the third diagnosis voltage. This will be described later in more detail with reference to FIGS. 3 to 13.

Figure 3:
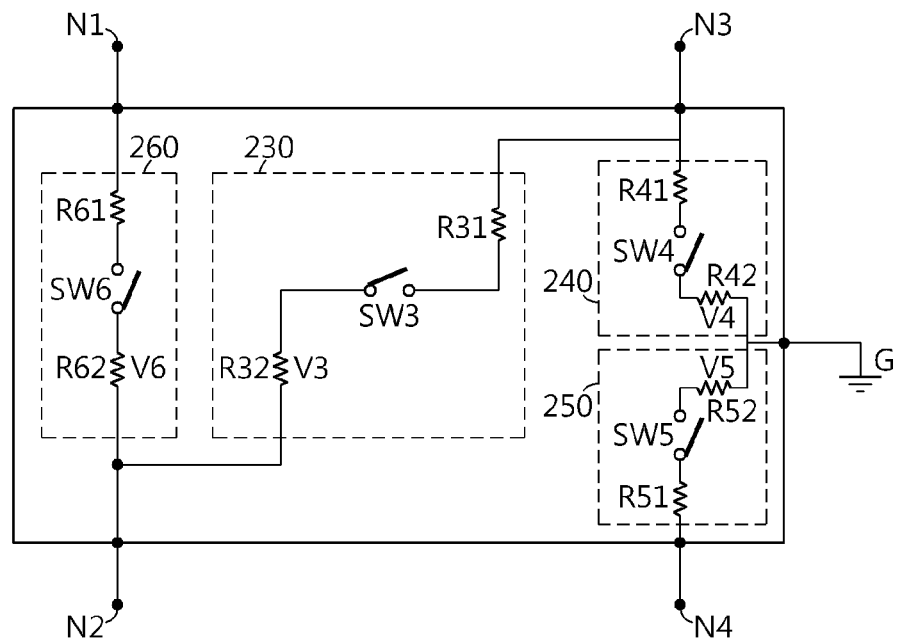
FIG. 3 is a diagram schematically showing diagnosis circuits, which may be included in the diagnosing unit according to an embodiment of the present disclosure.

FIG. 3 is a diagram schematically showing diagnosis circuits, which may be included in the diagnosing unit according to an embodiment of the present disclosure.

Referring to FIG. 3, the diagnosing unit 200 according to the present disclosure may include a plurality of diagnosis circuits. The plurality of diagnosis circuits may be configured to selectively connect two of the first node N1, the second node N2, the third node N3, the fourth node N4 and the ground G. In particular, the diagnosing unit 200 may include a first diagnosis circuit 230, a second diagnosis circuit 240 and a third diagnosis circuit 250.

The first diagnosis circuit 230 may be connected between the third node N3 and the second node N2. For example, as shown in FIGS. 2 and 3, the first diagnosis circuit 230 may be connected between the third node N3 to which the other end of the positive electrode contactor PC and one end of the positive electrode protection capacitor C1 are commonly connected and the second node N2 to which the negative electrode terminal of the battery module 100 and one end of the negative electrode contactor NC are commonly connected. In particular, the first diagnosis circuit 230 may be configured to measure the first diagnosis voltage applied between the third node N3 and the second node N2.

Specifically, the first diagnosis circuit 230 may include a third voltage dividing circuit and a third switch SW3. In particular, the third voltage dividing circuit and the third switch SW3 may be configured to be connectable in series with each other. Specifically, the third voltage dividing circuit may include a third protection resistor R31 and a third detection resistor R32. Here, the third protection resistor R31 and the third detection resistor R32 may divide the first diagnosis voltage applied between the third node N3 and the second node N2. For example, if the resistance of the third protection resistor R31 is 99 times the resistance of the third detection resistor R32, the first diagnosis voltage may be divided in a ratio of 1:99.

For example, as shown in FIG. 3, one end of the third protection resistor R31 may be connected to the third node N3, and one end of the third detection resistor R32 may be connected to the second node N2. Also, the other end of the third protection resistor R31 and the other end of the third detection resistor R32 may be connected to one end and the other end of the third switch SW3, respectively. Even though FIG. 3 depicts that the third switch SW3 is connected between the third protection resistor R31 and the third detection resistor R32, the present disclosure is not limited to the connection order.

Also, a third detection voltage V3 may be applied across the third detection resistor R32. At this time, the first diagnosis voltage may be calculated from the third detection voltage V3. For example, if the resistance of the third protection resistor R31 is 99 times the resistance of the third detection resistor R32, the first diagnosis voltage may be calculated to be 100 times the third detection voltage V3.

The third switch SW3 may apply the first diagnosis voltage to the third voltage dividing circuit. In particular, the third switch SW3 may apply the first diagnosis voltage to the third voltage dividing circuit in response to a control signal output from the diagnosing unit 200. For example, the first diagnosis voltage may be divided by the third voltage dividing circuit when the third switch SW3 is in the closed state.

The second diagnosis circuit 240 may be connected between the third node N3 and the ground G. For example, as shown in FIGS. 2 and 3, the second diagnosis circuit 240 may be connected between the ground G and the third node N3 to which the other end of the positive electrode contactor PC and one end of the positive electrode protection capacitor C1 are commonly connected. In particular, the second diagnosis circuit 240 may be configured to measure the second diagnosis voltage applied between the third node N3 and the ground G.

Specifically, the second diagnosis circuit 240 may include a fourth voltage dividing circuit and a fourth switch SW4. In particular, the fourth voltage dividing circuit and the fourth switch SW4 may be configured to be connectable in series with each other. Specifically, the fourth voltage dividing circuit may include a fourth protection resistor R41 and a fourth detection resistor R42. Here, the fourth protection resistor R41 and the fourth detection resistor R42 may divide the second diagnosis voltage applied between the third node N3 and the ground G. For example, if the resistance of the fourth protection resistor R41 is 99 times the resistance of the fourth detection resistor R42, the second diagnosis voltage may be divided in a ratio of 1:99.

For example, as shown in FIG. 3, one end of the fourth protection resistor R41 may be connected to the third node N3, and one end of the fourth detection resistor R42 may be connected to the ground G. Also, the other end of the fourth protection resistor R41 and the other end of the fourth detection resistor R42 may be connected to one end and the other end of the fourth switch SW4, respectively. Even though FIG. 3 depicts that the fourth switch SW4 is connected between the fourth protection resistor R41 and the fourth detection resistor R42, the present disclosure is not limited to this connection order.

In addition, a fourth detection voltage V4 may be applied across the fourth detection resistor R42. At this time, the second diagnosis voltage may be calculated from the fourth detection voltage V4. For example, if the resistance of the fourth protection resistor R41 is 99 times the resistance of the fourth detection resistor R42, the second diagnosis voltage may be calculated to be 100 times the fourth detection voltage V4.

The fourth switch SW4 may apply the second diagnosis voltage to the fourth voltage dividing circuit. In particular, the fourth switch SW4 may apply the second diagnosis voltage to the fourth voltage dividing circuit in response to a control signal output from the diagnosing unit 200. For example, the second diagnosis voltage may be divided by the fourth voltage dividing circuit when the fourth switch SW4 is in the closed state.

The third diagnosis circuit 250 may be connected between the fourth node N4 and the ground G. For example, as shown in FIGS. 2 and 3, the third diagnosis circuit 250 may be connected between the ground G and the fourth node N4 to which the other end of the negative electrode contactor NC and one end of the negative electrode protection capacitor C2 are commonly connected. In particular, the third diagnosis circuit 250 may be configured to measure the third diagnosis voltage applied between the fourth node N4 and the ground G.

Specifically, the third diagnosis circuit 250 may include a fifth voltage dividing circuit and a fifth switch SW5. In particular, the fifth voltage dividing circuit and the fifth switch SW5 may be configured to be connectable in series with each other. Specifically, the fifth voltage dividing circuit may include a fifth protection resistor R51 and a fifth detection resistor R52. Here, the fifth protection resistor R51 and the fifth detection resistor R52 may divide the third diagnosis voltage applied between the fourth node N4 and the ground G. For example, if the resistance of the fifth protection resistor R51 is 99 times the resistance of the fifth detection resistor R52, the third diagnosis voltage may be divided in a ratio of 1:99.

For example, as shown in FIG. 3, one end of the fifth protection resistor R51 may be connected to the fourth node N4, and one end of the fifth detection resistor R52 may be connected to the ground G. In addition, the other end of the fifth protection resistor R51 and the other end of the fifth detection resistor R52 may be connected to one end and the other end of the fifth switch SW5, respectively. Even though FIG. 3 shows that the fifth switch SW5 is connected between the fifth protection resistor R51 and the fifth detection resistor R52, the present disclosure is not limited to this connection order.

Also, a fifth detection voltage V5 may be applied across the fifth detection resistor R52. At this time, the third diagnosis voltage may be calculated from the fifth detection voltage V5. For example, if the resistance of the fifth protection resistor R51 is 99 times the resistance of the fifth detection resistor R52, the third diagnosis voltage may be calculated to be 100 times the fifth detection voltage V5.

The fifth switch SW5 may apply the third diagnosis voltage to the fifth voltage dividing circuit. In particular, the fifth switch SW5 may apply the third diagnosis voltage to the fifth voltage dividing circuit in response to a control signal output from the diagnosing unit 200. For example, the third diagnosis voltage may be divided by the fifth voltage dividing circuit when the fifth switch SW5 is in the closed state.

Preferably, the diagnosing unit 200 may further include a pack voltage measuring circuit 260 as shown in FIG. 3.

The pack voltage measuring circuit 260 may be connected between the first node N1 and the second node N2. For example, as shown in FIGS. 2 and 3, the pack voltage measuring circuit 260 may be connected between the first node N1 to which the positive electrode terminal of the battery module 100 and one end of the positive electrode contactor PC are commonly connected and the second node N2 to which the negative electrode terminal of the battery module 100 and one end of the negative electrode contactor NC are commonly connected. In particular, the pack voltage measuring circuit 260 may be configured to measure the voltage across of the battery module 100 applied between the first node N1 and the second node N2, namely the voltage across the battery assembly B.

Specifically, the pack voltage measuring circuit 260 may include a sixth voltage dividing circuit and a sixth switch SW6. In particular, the sixth voltage dividing circuit and the sixth switch SW6 may be configured to be connectable in series with each other. Specifically, the sixth voltage dividing circuit may include a sixth protection resistor R61 and a sixth detection resistor R62. Here, the sixth protection resistor R61 and the sixth detection resistor R62 may divide the voltage across the battery module 100 applied between the first node N1 and the second node N2, namely a both-end voltage of the battery module. For example, if the resistance of the sixth protection resistor R61 is 99 times the resistance of the sixth detection resistor R62, the both-end voltage of the battery module 100 may be divided in a ratio of 1:99.

For example, as shown in FIG. 3, one end of the sixth protection resistor R61 may be connected to the first node N1, and one end of the sixth detection resistor R62 may be coupled to the second node N2. Also, the other end of the sixth protection resistor R61 and the other end of the sixth detection resistor R62 may be connected to one end and the other end of the sixth switch SW6, respectively. Even though FIG. 3 shows that the sixth switch SW6 is connected between the sixth protection resistor R61 and the sixth detection resistor R62, the present disclosure is not limited to this connection order.

Also, a sixth detection voltage V6 may be applied across the sixth detection resistor R62. At this time, the both-end voltage of the battery module 100 may be calculated from the sixth detection voltage V6. For example, if the resistance of the sixth protection resistor R61 is 99 times the resistance of the sixth detection resistor R62, the both-end voltage of the battery module may be calculated to be 100 times the sixth detection voltage V6.

The sixth switch SW6 may apply the both-end voltage of the battery module 100 to the sixth voltage dividing circuit. In particular, the sixth switch SW6 may apply the both-end voltage of the battery module 100 to the sixth voltage dividing circuit in response to a control signal output from the diagnosing unit 200. For example, the both-end voltage of the battery module 100 may be divided by the sixth voltage dividing circuit when the sixth switch SW6 is in the closed state.

Preferably, the ratio between the resistance of the third protection resistor R31 and the resistance of the third detection resistor R32 may be designed to be identical to the ratio between the resistance of the fourth protection resistor R41 and the resistance of the fourth detection resistor R42, the ratio between the resistance of the fifth protection resistor R51 and the resistance of the fifth detection resistor R52, and the ratio between the resistance of the sixth protection resistor R61 and the resistance of the sixth detection resistor R62. At this time, in order to protect the third detection resistor R32, the fourth detection resistor R42, the fifth detection resistor R52 and the sixth detection resistor R62 from a high voltage, the resistance of the third protection resistor R31, the fourth protection resistor R41, the fifth protection resistor R51 and the sixth protection resistor R61 may be designed to be sufficiently larger than the resistance of the third detection resistor R32, the fourth detection resistor R42, the fifth detection resistor R52 and the sixth detection resistor R62, respectively. For example, the resistance of the third protection resistor R31, the fourth protection resistor R41, the fifth protection resistor R51 and the sixth protection resistor R61 may be 99 times the resistance of the third detection resistor R32, the fourth detection resistor R42, the fifth detection resistor R52 and the sixth detection resistor R62, respectively.

The diagnosing unit 200 may control the switches provided at the first diagnosis circuit 230, the second diagnosis circuit 240, the third diagnosis circuit 250 and the pack voltage measuring circuit 260, respectively. In particular, the diagnosing unit 200 may control turning-on and turning-off operations of the third switch SW3, the fourth switch SW4, the fifth switch SW5 and the sixth switch SW6 respectively provided at the first diagnosis circuit 230, the second diagnosis circuit 240, the third diagnosis circuit 250 and the pack voltage measuring circuit 260. With this configuration, the diagnosing unit 200 may determine whether the positive electrode contactor PC is short-circuited. Specifically, the diagnosing unit 200 may determine whether the positive electrode contactor PC is short-circuited, by selectively turning on and off each of the third switch SW3, the fourth switch SW4, the fifth switch SW5 and the sixth switch SW6. In particular, the diagnosing unit 200 may determine whether the positive electrode contactor PC is short-circuited sequentially or simultaneously, by selectively turning on and off each of the first switch SW1, the second switch SW2, the third switch SW3, the fourth switch SW4, the fifth switch SW5 and the sixth switch SW6.

With this configuration, the apparatus for diagnosing a positive electrode contactor of a battery pack P according to the present disclosure may determine whether the battery module 100 is electrically leaky and whether the positive electrode contactor PC is short-circuited, simultaneously, thereby making it possible to quickly determine whether or not the positive electrode contactor PC is short-circuited.

Figure 4:
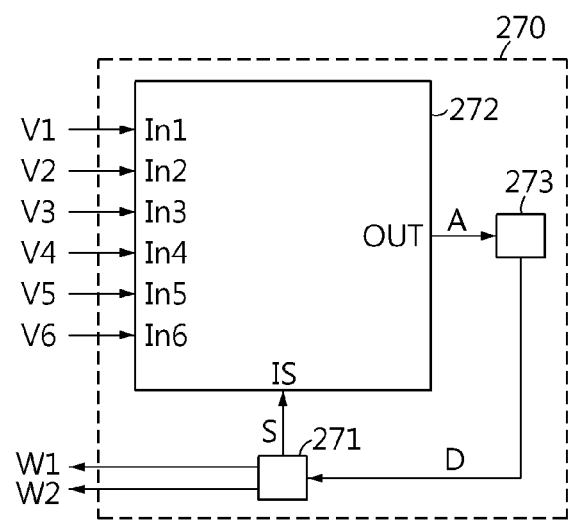
FIG. 4 is a diagram schematically showing a functional configuration of a control unit, which controls operations of the diagnosing unit according to an embodiment of the present disclosure.

FIG. 4 is a diagram schematically showing a functional configuration of a control unit, which controls operations of the diagnosing unit according to an embodiment of the present disclosure.

Referring to FIG. 4, the diagnosing unit 200 according to the present disclosure may include a control unit 270. Preferably, the control unit 270 may include a microprocessor 271, a multiplexer 272, and an analog-to-digital converter (ADC) 273.

The microprocessor 271 may manage the overall operation of the diagnosing unit 200. The microprocessor 271 may be communicatively connected to other components included in the diagnosing unit 200 to transmit and receive signals related to the power system 1000. In particular, the microprocessor 271 may output a signal specifying the operating states of a plurality of contactors and a plurality of switches. That is, the microprocessor 271 may control the plurality of contactors and the plurality of switches respectively to induce each of the contactors and each of the switches into an open state or a closed state. Also, the microprocessor 271 may output a selection command signal S for commanding to select at least one of the first to sixth detection voltages V1, V2, V3, V4, V5, V6 according to a predetermined rule.

Preferably, the microprocessor 271 may have at least one memory. That is, microprocessor 271 may include at least one memory. Programs and data associated with various operations performed by the apparatus for diagnosing a positive electrode contactor PC of the battery pack P may be pre-stored in the memory. For example, the resistance of the resistors respectively included in the first voltage measuring unit 210, the second voltage measuring unit 220, the first diagnosis circuit 230, the second diagnosis circuit 240, the third diagnosis circuit 250, and the pack voltage measuring circuit 260 may be stored in the memory. Also, data and software for determining whether the battery module 100 is electrically leaky and whether the positive electrode contactor PC is short-circuited based on the first to sixth detection voltages V1, V2, V3, V4, V5, V6 may be stored in the memory.

The multiplexer 272 may include a plurality of voltage input ports In1 to In6, a selection input port IS, and an output port OUT. The plurality of voltage input ports In1 to In6 may be configured to receive a plurality of detection voltages V1 to V6, respectively. For example, as shown in FIG. 4, the plurality of detection voltages V1 to V6 generated by the first voltage measuring unit 210, the second voltage measuring unit 220, the first diagnosis circuit 230, the second diagnosis circuit 240, the third diagnosis circuit 250 and the pack voltage measuring circuit 260 may be applied to the plurality of voltage input ports In1 to In6, respectively.

The selection input port IS may be configured to receive the selection command signal S that allows to select any one among the plurality of detection voltages V1 to V6. For example, as shown in FIG. 4, the selection command signal S output from the microprocessor 271 may be input to the selection input port IS.

The output port OUT may be configured to output a detection voltage selected from the plurality of detection voltages V1 to V6. For example, as shown in FIG. 4, the multiplexer 272 may select any one among the plurality of voltage input ports In1 to In6 based on the selection command signal S input to the selection input port IS and output the selected voltage input port to the output port OUT. At this time, the output port OUT may output one of the plurality of detection voltages V1 to V6.

The ADC 273 may be configured to convert an analog signal A provided from the multiplexer 272 into a digital signal D and then transmit the digital signal D to the microprocessor 271. The analog signal A may be any one of the plurality of detection voltages V1 to V6. At this time, the microprocessor 271 may determine the plurality of detection voltages V1 to V6 based on the digital signal D received from the ADC 273. Also, the microprocessor 271 may measure the first measurement voltage, the second measurement voltage, the first diagnosis voltage, the second diagnosis voltage, the third diagnosis voltage and the both-end voltage of the battery module based on the plurality of detection voltages V1 to V6.

For example, if the third voltage input port In3 is selected by the selection command signal S among the plurality of voltage input ports In1 to In6, the multiplexer 272 may connect the third voltage input port In3 and the output port OUT. Subsequently, the ADC 273 may convert the analog signal A of the third detection voltage V3 transmitted from the multiplexer 272 into a digital signal D of the third detection voltage V3, and transmit the digital signal D of the third detection voltage V3 to the microprocessor 271. Subsequently, the microprocessor 271 may determine the first diagnosis voltage based on the digital signal D transmitted from the ADC 273.

The microprocessor 271 may respectively determine whether the battery module 100 is electrically leaky and whether the positive electrode contactor PC is short-circuited, based on the measurement results of the first measurement voltage, the second measurement voltage, the first diagnosis voltage, the second diagnosis voltage, the third diagnosis voltage and the both-end voltage of the battery module 100, and then output alarm signals W1, W2 for notifying the result of the determination. For example, the first alarm signal W1 may be an alarm signal that notifies whether the battery module 100 is electrically leaky. Also, the second alarm signal W2 may be an alarm signal for notifying whether the positive electrode contactor PC is short-circuited.

For example, the first alarm signal W1 and the second alarm signal W2 output from the microprocessor 271 may be converted into a form recognizable by the user through an information guiding device (not shown) provided at the power system 1000 and/or an electric vehicle. For example, the information guiding device may convert the alarm signals W1, W2 into visual and/or audible signals and output them.

Figure 5:
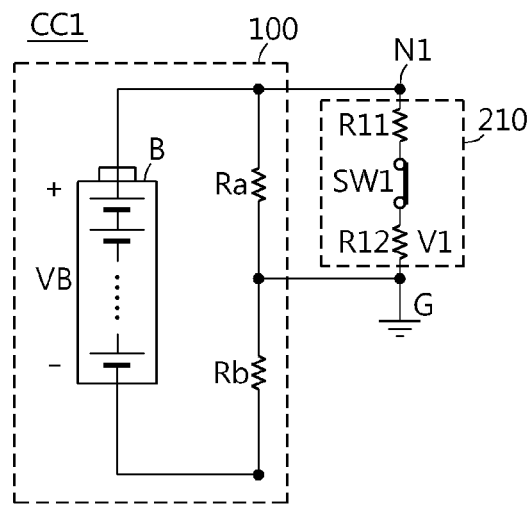
FIGS. 5 and 6 are diagrams for illustrating the operation of determining whether an electric leakage occurs at the battery module, performed by the apparatus for diagnosing a positive electrode contactor of a battery pack according to an embodiment of the present disclosure.
Figure 6:
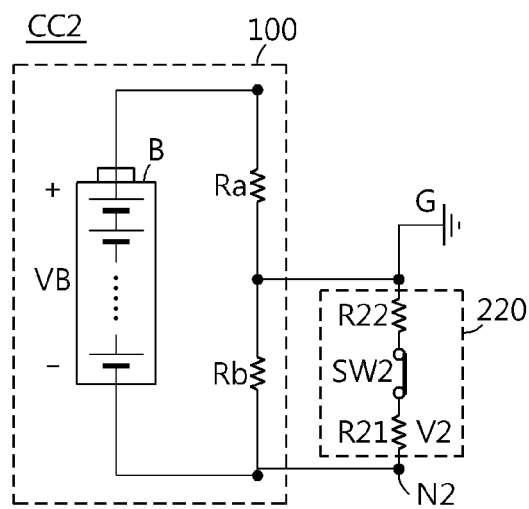

FIGS. 5 and 6 are diagrams for illustrating the operation of determining whether an electric leakage occurs at the battery module, performed by the apparatus for diagnosing a positive electrode contactor of a battery pack according to an embodiment of the present disclosure.

Referring to FIGS. 2 and 5, the control unit 270 may control the first switch SW1 into the closed state and the second switch SW2 into the open state to form a first circuit CC1.

The control unit 270 may measure the first measurement voltage. In particular, the control unit 270 may measure the first measurement voltage based on the first detection voltage V1 provided from the first voltage measuring unit 210 while the first circuit CC1 is being formed.

The control unit 270 may determine whether the battery module 100 is electrically leaky, namely whether the battery assembly B is electrically leaky. In particular, the control unit 270 may determine whether the positive electrode the battery assembly B is electrically leaky, by using the magnitude of the first measurement voltage. For example, if the positive electrode of the battery assembly B is electrically leaky, the resistance of the first insulation resistor Ra becomes much smaller than the case where there is no electric leakage. Accordingly, when the positive electrode of the battery assembly B is electrically leaky, most of the battery assembly voltage VB is applied to the second insulation resistor Rb, and thus the magnitude of the first measurement voltage measured during the electric leakage is smaller than the value measured when there is no electric leakage. At this time, the control unit 270 may determine that the positive electrode of the battery assembly B is electrically leaky when the magnitude of the first measurement voltage decreases.

Referring to FIGS. 2 and 6, the control unit 270 may control the second switch SW2 into the closed state and the first switch SW1 into the open state to form a second circuit CC2.

The control unit 270 may measure the second measurement voltage. In particular, the control unit 270 may measure the second measurement voltage based on the second detection voltage V2 provided from the second voltage measuring unit 220 while the second circuit CC2 is being formed.

The control unit 270 may determine whether the battery module 100 is electrically leaky, namely whether the battery assembly B is electrically leaky. In particular, the control unit 270 may determine whether the negative electrode of the battery assembly B is electrically leaky, by using the magnitude of the second measurement voltage. For example, if the negative electrode of battery assembly B is electrically leaky, the resistance of the second insulation resistor Rb becomes much smaller than the case where there is no electric leakage. Accordingly, if the negative electrode of the battery assembly B is electrically leaky, most of the battery assembly voltage VB is applied to the first insulation resistor Ra, and thus the magnitude of the second measurement voltage measured during the electric leakage is smaller than the value measured when there is no electric leakage. At this time, the control unit 270 may determine that the negative electrode of the battery assembly B is electrically leaky when the magnitude of the second measurement voltage decreases.

Figure 7:
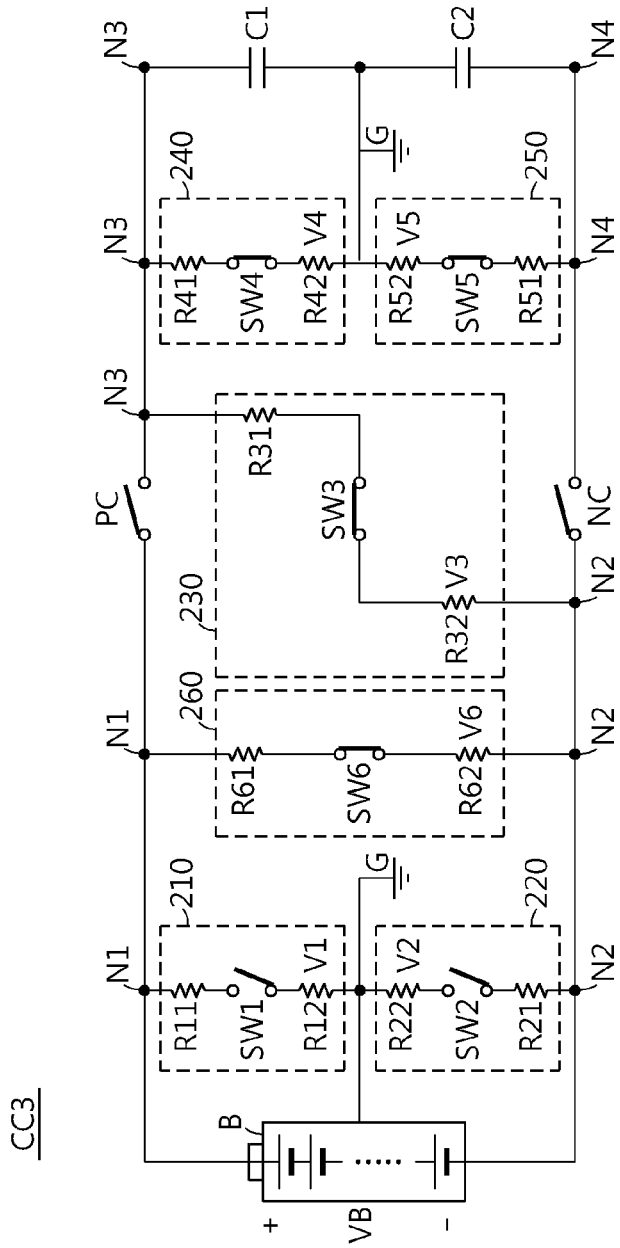
FIG. 7 is a diagram for illustrating the operation of determining whether a short circuit occurs at the positive electrode contactor, performed by the apparatus for diagnosing a positive electrode contactor of a battery pack according to an embodiment of the present disclosure.

FIG. 7 is a diagram for illustrating the operation of determining whether a short circuit occurs at the positive electrode contactor, performed by the apparatus for diagnosing a positive electrode contactor of a battery pack according to an embodiment of the present disclosure. For convenience of explanation, the first insulation resistor Ra and the second insulation resistor Rb are not depicted in FIG. 7, and FIG. 7 shows a circuit in a normal state where the positive electrode contactor PC is not short-circuited.

The circuit shown in FIG. 7 is a third circuit CC3 formed in the power system 1000 to determine whether a short circuit occurs due to a fault of the positive electrode contactor PC. Referring to FIGS. 2 and 3 together, the control unit 270 may control the third switch SW3, the fourth switch SW4, the fifth switch SW5 and the sixth switch SW6 into the closed state and control the first switch SW1 and the second switch SW2 into the open state to form the third circuit CC3.

The diagnosing unit 200 may alternately repeat a first switching cycle and a second switching cycle. For example, after the first switching cycle is performed, the second switching cycle may be performed, and then the first switching cycle may be performed again. At this time, the first switching cycle and the second switching cycle may be set have the same length. In particular, the diagnosing unit 200 may alternately repeat the first switching cycle and the second switching cycle by selectively turning on and off each of the first switch SW1, the second switch SW2 and the third switch SW3. More specifically, in the first switching cycle, the diagnosing unit 200 may control the first switch SW1 and the third switch SW3 into the closed state and the second switch SW2 into the open state. Also, in the second switching cycle, the diagnosing unit 200 may control the first switch SW1 into the open state and the second switch SW2 and the third switch SW3 into the closed state.

The diagnosing unit 200 may measure the first diagnosis voltage, the second diagnosis voltage and the third diagnosis voltage during the first switching cycle and the second switching cycle. For example, as shown in FIG. 7, the diagnosing unit 200 may measure the first diagnosis voltage applied between the third node N3 and the second node N2 during the first switching cycle and the second switching cycle.

Also, the diagnosing unit 200 may measure the voltage applied to the positive electrode protection capacitor C1. In particular, the diagnosing unit 200 may measure the second diagnosis voltage during the first switching cycle and the second switching cycle, and measure the voltage applied to the positive electrode protection capacitor C1 based on the measured second diagnosis voltage.

In addition, the diagnosing unit 200 may measure the voltage applied to the negative electrode protection capacitor C2. In particular, the diagnosing unit 200 may measure the third diagnosis voltage during the first switching cycle and the second switching cycle and measure the voltage applied to the negative electrode protection capacitor C2 based on the measured third diagnosis voltage.

Preferably, the diagnosing unit 200 may diagnose whether the positive electrode contactor PC is short-circuited by using the first diagnosis voltage. In particular, the diagnosing unit 200 may determine whether the positive electrode contactor PC is short-circuited by using the first diagnosis voltage measured during the first switching cycle and the second switching cycle.

More preferably, the diagnosing unit 200 may diagnose whether the positive electrode contactor PC is short-circuited by using the second diagnosis voltage and the third diagnosis voltage. In particular, the diagnosing unit 200 may determine whether the positive electrode contactor PC is short-circuited by using the second diagnosis voltage and the third diagnosis voltage measured during the first switching cycle and the second switching cycle. This will be described later in more detail with reference to FIGS. 8 to 11.

Figure 8:
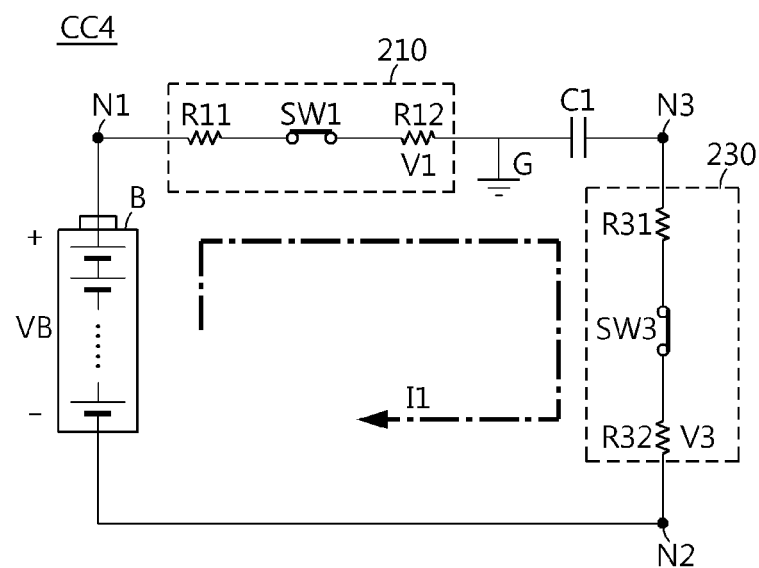
FIGS. 8 and 9 are diagrams schematically showing some circuits, which may be formed by the apparatus for diagnosing a positive electrode contactor of a battery pack according to an embodiment of the present disclosure.
Figure 9:
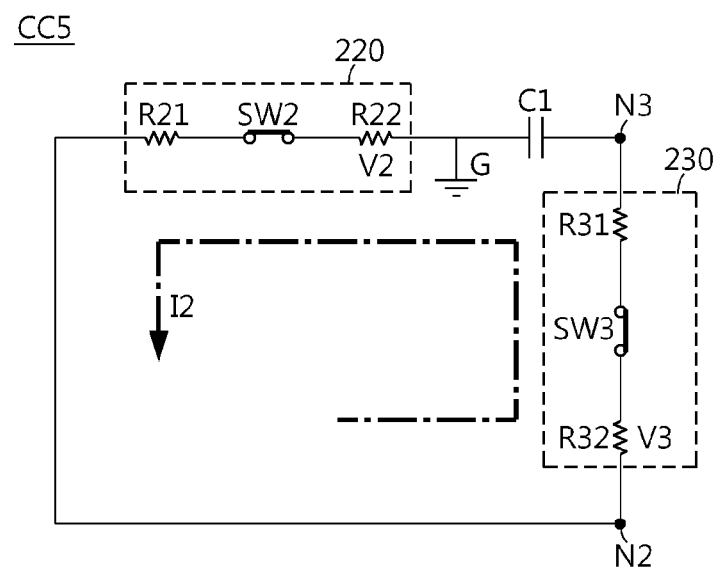

FIGS. 8 and 9 are diagrams schematically showing some circuits, which may be formed by the apparatus for diagnosing a positive electrode contactor of a battery pack according to an embodiment of the present disclosure. For convenience of explanation, the first insulation resistor Ra, the second insulation resistor Rb, the pack voltage measuring circuit 260, the second diagnosis circuit 240 and the third diagnosis circuit 250 are not depicted in FIGS. 8 and 9, and it is assumed that the battery assembly voltage VB is measured in advance.

The circuit shown in FIGS. 8 and 9 is a closed circuit that may be formed in the third circuit CC3 of FIG. 7 during the first switching cycle and the second switching cycle. That is, the circuit shown in FIG. 8 is a fourth circuit CC4 that may be formed in the third circuit CC3 during the first switching cycle, and the circuit shown in FIG. 9 is a fifth circuit CC5 that may be formed in the third circuit CC3 during the second switching cycle.

First, referring to FIGS. 7 and 8, the diagnosing unit 200 may control the first switch SW1 and the third switch SW3 into the closed state and the second switch SW2 into the open state to form the fourth circuit CC4. That is, the fourth circuit CC4 is a circuit that may be formed while the first switch SW1 and the third switch SW3 are in the closed state, and the second switch SW2, the positive electrode contactor PC and the negative electrode contactor NC are in the open state. For example, as shown in FIG. 8, the fourth circuit CC4 is an electrically closed circuit that includes the positive electrode terminal of the battery assembly B, the first node N1, the first voltage measuring unit 210, the ground G, the positive electrode protection capacitor C1, the third node N3, the first diagnosis circuit 230 and the second node N2.

Referring to FIGS. 7 and 9, the diagnosing unit 200 may control the second switch SW2 and the third switch SW3 into the closed state and the first switch SW1 into the open state to form the fifth circuit CC5. Namely, the fifth circuit CC5 is a circuit that may be formed while the second switch SW2 and the third switch SW3 are in the closed state, and the first switch SW1, the positive electrode contactor PC and the negative electrode contactor NC are in the open state. For example, as shown in FIG. 9, the fifth circuit CC5 is an electrically closed circuit that includes the second voltage measuring unit 220, the ground G, the positive electrode protection capacitor C1, the third node N3, the first diagnosis circuit 230 and the second node N2.

The diagnosing unit 200 may determine whether the positive electrode contactor PC is short-circuited. Referring to FIGS. 2 and 7 together, the diagnosing unit 200 may turn on the positive electrode contactor PC and the negative electrode contactor NC so that the charge/discharge current flows on the charge-discharge path connected to the battery module 100, and then turn off the positive electrode contactor PC and the negative electrode contactor NC. Then, the diagnosing unit 200 may determine whether the positive electrode contactor PC is short-circuited by checking whether the positive electrode contactor PC is normally turned off.

For example, as shown in FIGS. 2 and 7, the diagnosing unit 200 may turn on the positive electrode contactor PC and the negative electrode contactor NC so that the charge/discharge current flows on the charge-discharge path connected to the battery module 100. Here, the positive electrode protection capacitor C1 may be charged by the charge/discharge current. More specifically, the voltage of the positive electrode terminal of the battery module 100 may be applied to one end of the positive electrode protection capacitor C1 connected to the third node N3. By doing so, the positive electrode protection capacitor C1 may be charged by the voltage of the positive electrode terminal of the battery module 100.

Subsequently, the diagnosing unit 200 may turn off the positive electrode contactor PC and the negative electrode contactor NC and check whether the positive electrode contactor PC is normally turned off. Here, referring to FIGS. 7 to 9, the third circuit CC3 is a circuit at which the positive electrode contactor PC is normally turned off, and the fourth circuit CC4 and the fifth circuit CC5 are circuits that may be formed during the first switching cycle and the second switching cycle in a state where the positive electrode contactor PC and the negative electrode contactor NC are turned off.

The diagnosing unit 200 may measure the voltage applied between the third node N3 and the second node N2. In particular, the diagnosing unit 200 may measure the first diagnosis voltage applied between the third node N3 and the second node N2 during the first switching cycle and the second switching cycle. For example, as shown in FIGS. 8 and 9, the diagnosing unit 200 may measure the first diagnosis voltage based on the first detection voltage V1 and the third detection voltage V3 measured during the first switching cycle. Also, the diagnosing unit 200 may measure the first diagnosis voltage based on the second detection voltage V2 and the third detection voltage V3 measured during the second switching cycle.

For example, as shown in FIG. 8, if the fourth circuit CC4 is formed, the first assembly current I1 flows from the positive electrode terminal of the battery assembly B toward the negative electrode terminal of the battery assembly B by the battery assembly voltage VB. At this time, since the positive electrode protection capacitor C1 is in a charged state as described above, the voltage applied to the positive electrode protection capacitor C1 may be equal to the voltage value of the battery assembly B. Subsequently, the positive electrode protection capacitor C1 is gradually discharged. Specifically, the positive electrode protection capacitor C1 is gradually discharged by outputting the charging power in a direction along which the first current I1 flows.

For example, as shown in FIG. 9, if the fifth circuit CC5 is formed, as the second current I2 flows in the direction opposite to the first current I1, a reverse voltage is applied to the positive electrode protection capacitor C1. That is, the third detection voltage V3 detected by the diagnosing unit 200 has a negative value. At this time, the absolute value of the voltage applied to the positive electrode protection capacitor C1 may be equal to the voltage value of the battery assembly B. Subsequently, the positive electrode protection capacitor C1 is gradually discharged. Specifically, the positive electrode protection capacitor C1 is gradually discharged by outputting the electric power applied by the reverse voltage in a direction along which the second current I2 flows.

Figure 10:
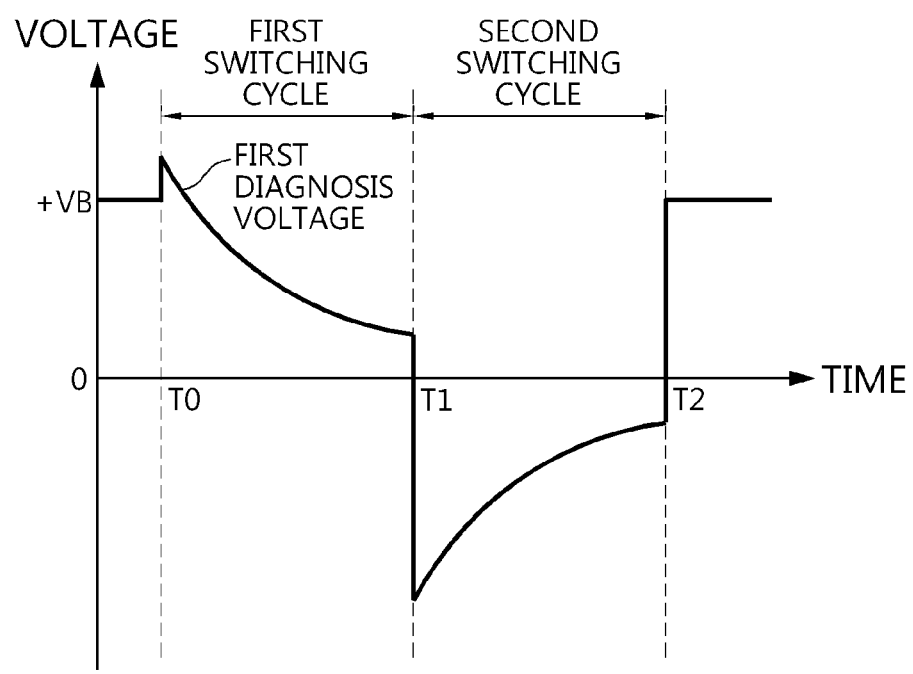
FIG. 10 is a graph schematically showing the change of a first diagnosis voltage according to time, which is measured by the apparatus for diagnosing a positive electrode contactor of a battery pack according to an embodiment of the present disclosure.

FIG. 10 is a graph schematically showing the change of a first diagnosis voltage according to time, which is measured by the apparatus for diagnosing a positive electrode contactor of a battery pack according to an embodiment of the present disclosure.

The graph of FIG. 10 shows the change of the first diagnosis voltage according to time in a normal state where a short circuit caused by a fault does not occur at the positive electrode contactor PC and the negative electrode contactor NC. Here, in the regions before T0 and after T2, both the positive electrode contactor PC and the negative electrode contactor NC are turned on, and in the region from T0 to T2, both the positive electrode contactor PC and the negative electrode contactor NC are turned off.

Referring to FIG. 7 together, in the regions before T0 and after T2, the positive electrode contactor PC is turned on so that the terminal voltage of the battery assembly B is applied between the third node N3 and the second node N2, and thus the first diagnosis voltage may be kept at a constant positive value. For example, the first diagnosis voltage may be equal to the battery assembly voltage VB.

During the first switching cycle corresponding to the region from T0 to T1 where the fourth circuit CC4 of FIG. 8 is formed, the diagnosing unit 200 may record a first pattern that includes a plurality of measurement values of the first diagnosis voltage according to time.

During the second switching cycle corresponding to the region from T1 to T2 where the fifth circuit CC5 of FIG. 9 is formed, the diagnosing unit 200 may record a second pattern that includes a plurality of measurement values of the first diagnosis voltage according to time. For example, as shown in the graph of FIG. 10, the first pattern may be a pattern having a positive value (namely, exceeding 0V) whose absolute value gradually decreases, and the second pattern may be a pattern having a negative value (namely, less than 0V) whose absolute value gradually decreases.

If the first diagnosis voltage has a positive value and the absolute value of the first diagnosis voltage gradually decreases during the first switching cycle, the diagnosing unit 200 may determine that the positive electrode contactor PC is in a normal state without a short circuit. Also, if the first diagnosis voltage has a negative value and the absolute value of the first diagnosis voltage gradually decreases during the second switching cycle, the diagnosing unit 200 may determine that the positive electrode contactor PC is in a normal state without a short circuit. For example, the diagnosing unit 200 may determine that the positive electrode contactor PC is in the normal state if the first pattern recorded during the first switching cycle and the second pattern recorded during the second switching cycle have the form as shown in FIG. 10.

Figure 11:
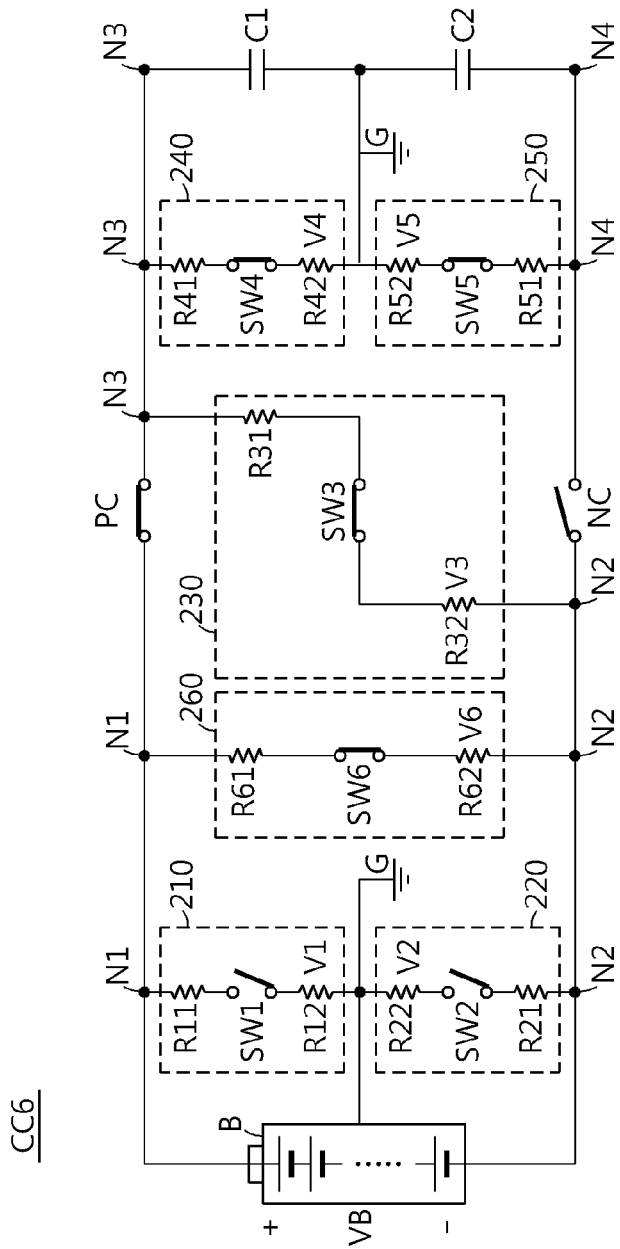
FIG. 11 is a diagram for illustrating the operation of determining whether a short circuit occurs at the positive electrode contactor, performed by an apparatus for diagnosing a positive electrode contactor of a battery pack according to another embodiment of the present disclosure.

FIG. 11 is a diagram for illustrating the operation of determining whether a short circuit occurs at the positive electrode contactor, performed by an apparatus for diagnosing a positive electrode contactor of a battery pack according to another embodiment of the present disclosure. Here, features different from the former embodiment will be mainly described, and the features identical or similar to those of the former embodiment will be not be described in detail. FIG. 11 is a circuit diagram showing a positive electrode contactor PC in a short-circuited state.

The circuit shown in FIG. 11 is a sixth circuit CC6 formed in the power system 1000 to determine whether a short circuit occurs due to a fault of the positive electrode contactor PC.

If the positive electrode contactor PC is short-circuited due to a fault, the positive electrode contactor PC is short-circuited to keep the turn-on state even though the diagnosing unit 200 turns off the positive electrode contactor PC. At this time, the first node N1 and the third node N3 may be electrically connected through the positive electrode contactor PC. In this case, since the battery assembly voltage VB is applied to the first diagnosis circuit 230, the third detection voltage V3 does not conform to the pattern shown in FIG. 10 during the first switching cycle and the second switching cycle.

Figure 12:
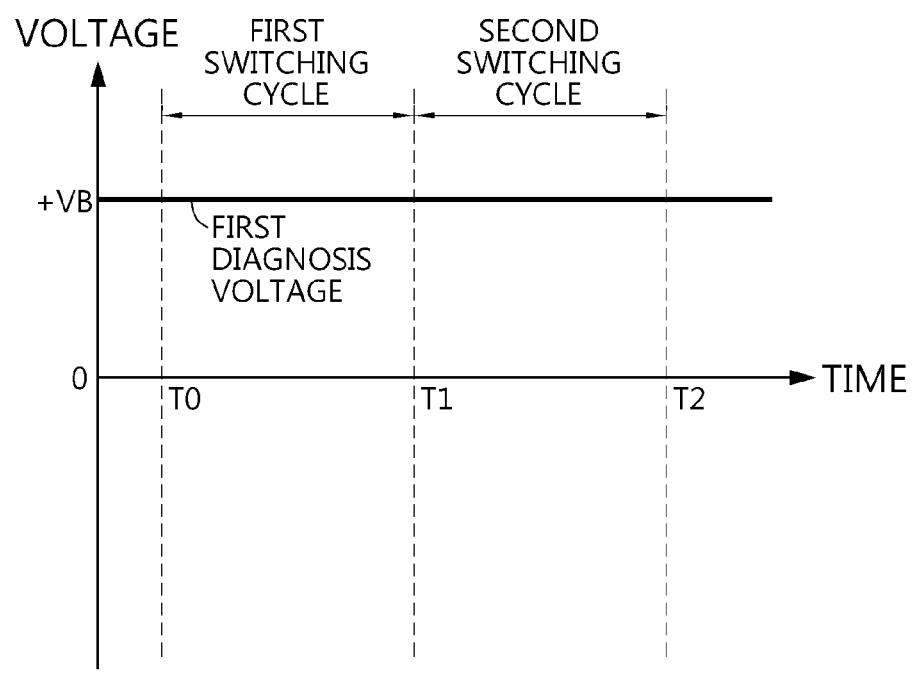
FIG. 12 is a graph schematically showing the change of the first diagnosis voltage according to time, which is measured by the apparatus for diagnosing a positive electrode contactor of a battery pack according to another embodiment of the present disclosure.

FIG. 12 is a graph schematically showing the change of the first diagnosis voltage according to time, which is measured by the apparatus for diagnosing a positive electrode contactor of a battery pack according to another embodiment of the present disclosure. Here, features different from the former embodiment will be mainly described, and the features identical or similar to those of the former embodiment will be not be described in detail.

The graph shown in FIG. 12 shows the change of the first diagnosis voltage according to time when the positive electrode contactor PC is short-circuited due to a fault. Here, in the regions before T0 and after T2, both the positive electrode contactor PC and the negative electrode contactor NC are turned on, and in the region from T0 to T2, the positive electrode contactor PC is short-circuited.

If the first diagnosis voltage has a positive value and is kept constantly during the first switching cycle and the second switching cycle, the diagnosing unit 200 may determine that the positive electrode contactor PC is in a fault state due to short circuit.

Referring to FIG. 11 together, if the positive electrode contactor PC is short-circuited, the positive electrode terminal of battery assembly B may be connected to the third node N3 through the positive electrode contactor PC, and the negative electrode terminal of battery assembly B may be connected to the second node N2, thereby applying the battery assembly voltage V B to the first diagnosis circuit 230. In this case, unlike the case of FIGS. 7 and 10, the first diagnosis voltage may be kept constantly during the first switching cycle and the second switching cycle. Specifically, the diagnosing unit 200 may determine that the positive electrode contactor PC is in a short-circuited state if the first pattern recorded during the first switching cycle and the second pattern recorded during the second switching cycle have the form as shown in FIG. 12.

With this configuration, the apparatus for diagnosing a positive electrode contactor of a battery pack P according to the present disclosure may determine whether the positive electrode contactor PC is short-circuited through the measured patterns of the first diagnosis voltage. Thus, it is possible to simply determine whether the positive electrode contactor PC is short-circuited.

Figure 13:
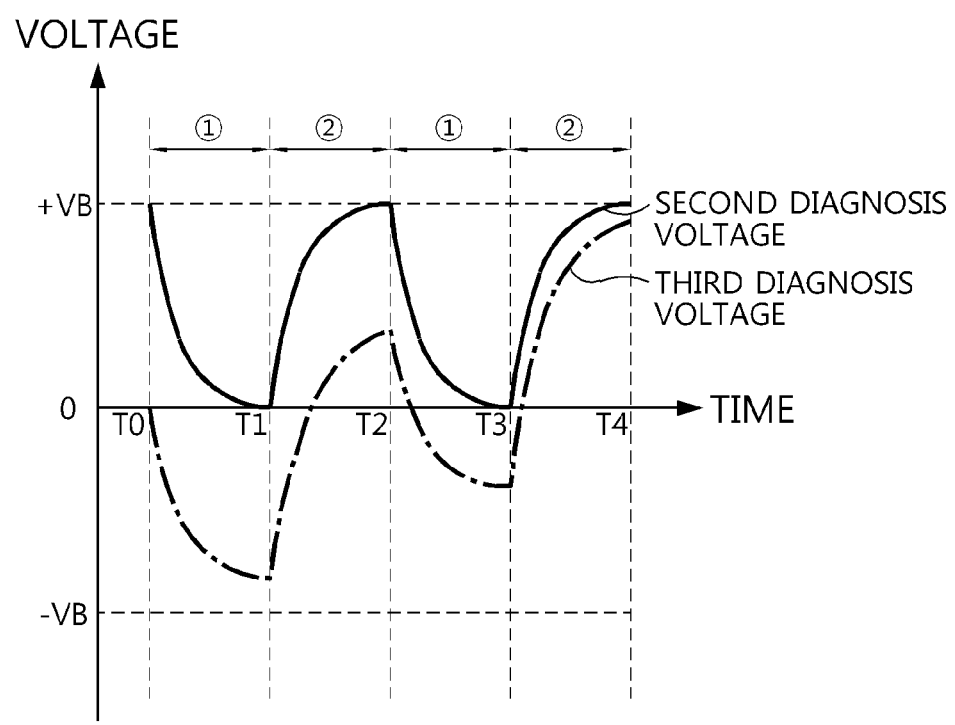
FIGS. 13 to 15 are graphs schematically showing the change of a second diagnosis voltage and a third diagnosis voltage according to time, which is measured by the apparatus for diagnosing a positive electrode contactor of a battery pack according to another embodiment of the present disclosure.
Figure 14:
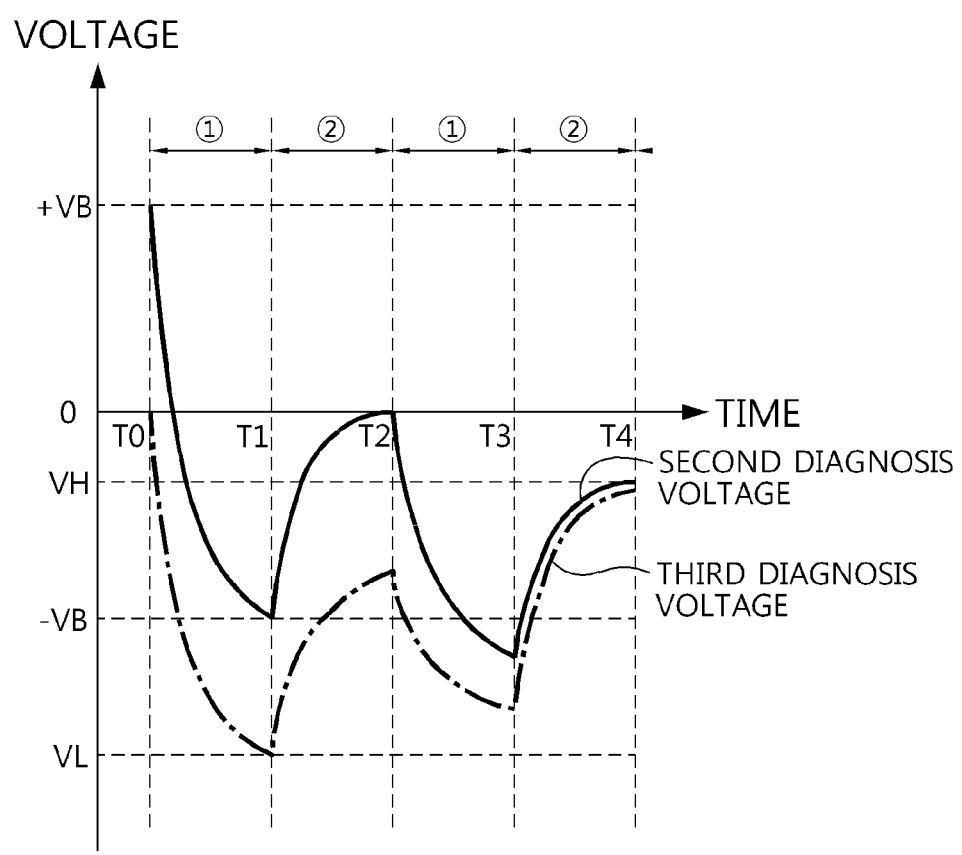
Figure 15:
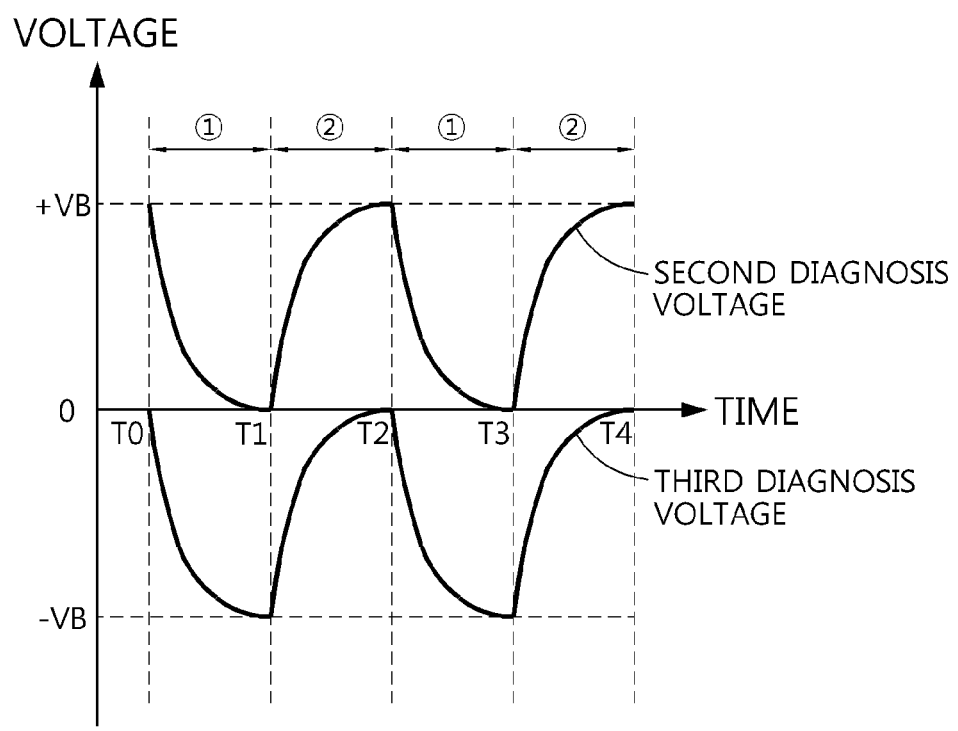

FIGS. 13 to 15 are graphs schematically showing the change of a second diagnosis voltage and a third diagnosis voltage according to time, which is measured by the apparatus for diagnosing a positive electrode contactor of a battery pack according to another embodiment of the present disclosure. In the graphs shown in FIGS. 13 to 15, ① means the first switching cycle, and ② means the second switching cycle.

First, the graph of FIG. 13 shows the change of the second diagnosis voltage and the third diagnosis voltage according to time when the positive electrode contactor PC is short-circuited due to a fault. Here, the regions from T0 to T1 and from T2 to T3 are the first switching cycle, and the regions from T1 to T2 and from T3 to T4 are the second switching cycle. Also, in the region from T0 to T4, the positive electrode contactor PC is in the short-circuited state.

The diagnosing unit 200 may record a plurality of measurement values of the second diagnosis voltage and a plurality of measurement values of the third diagnosis voltage during the first switching cycle and the second switching cycle that are repeated. For example, as shown in the graph FIG. 13, the diagnosing unit 200 may record a third pattern that includes a plurality of measurement values of the second diagnosis voltage according to time while the first switching cycle and the second switching cycle are repeated two times. Also, the diagnosing unit 200 may record a fourth pattern that includes a plurality of measurement values of the third diagnosis voltage according to time while the first switching cycle and the second switching cycle are repeated two times.

If the second diagnosis voltage has a value of 0 or more and the difference between the second diagnosis voltage and the third diagnosis voltage gradually decreases during the first switching cycle and the second switching cycle, the diagnosing unit 200 may determine that the positive electrode contactor PC is in a fault state due to short circuit.

For example, as shown in the graph of FIG. 13, if the third pattern has a value of 0 or more and also has a constant upper limit of 0 or more and a constant lower limit of 0 or more while the third diagnosis voltage gradually increases so that the difference of the voltage values between the third pattern and the fourth pattern gradually decreases, the diagnosing unit 200 may determine that the positive electrode contactor PC is in a fault state due to short circuit.

For example, if the third pattern and the fourth pattern recorded during the first switching cycle and the second switching cycle, which are repeated, have the form as shown in FIG. 13, the diagnosing unit 200 may determine that the positive electrode contactor PC is in a fault state due to short circuit.

Here, referring to FIGS. 14 and 15, the graph of FIG. 14 shows the third pattern and the fourth pattern when both the positive electrode contactor PC and the negative electrode contactor NC are in the normal state. Also, the graph of FIG. 15 shows the third pattern and the fourth pattern when both the positive electrode contactor PC and the negative electrode contactor NC are in a fault state due to short circuit.

As shown in the graph of FIG. 14, if both the positive electrode contactor PC and the negative electrode contactor NC are in the normal state, the second diagnosis voltage does not have a value of 0 or more but gradually decreases to have an upper limit VH of 0 or less and a lower limit VL of 0 or less. Also, the third diagnosis voltage does not show a gradual increase.

As shown in the graph of FIG. 15, if both the positive electrode contactor PC and the negative electrode contactor NC are in a fault state due to short circuit, the third diagnosis voltage does not show a gradual increase, and the difference between the voltage value of the second diagnosis voltage and the voltage value of the third diagnosis voltage does not gradually decrease.

With this configuration, the apparatus for diagnosing a positive electrode contactor of a battery pack P according to the present disclosure may determine whether only the positive electrode contactor PC is short-circuited. Specifically, by comparing the forms depicted in the graphs of FIGS. 14 and 15 with the graph of FIG. 13, it is possible to determine whether only the positive electrode contactor PC is short-circuited, in a way distinguished from the case where both the positive electrode contactor PC and the negative electrode contactor NC are short-circuited.

The apparatus for diagnosing a positive electrode contactor of a battery pack P according to the present disclosure may be provided in the battery pack P itself. That is, the battery pack P according to the present disclosure may include the apparatus for diagnosing a positive electrode contactor of a battery pack P of the present disclosure described above. Here, the battery pack P may include at least one secondary battery, the apparatus for diagnosing a positive electrode contactor of a battery pack P, electrical components (BMS, relay, fuse, etc.), a case and the like. In this configuration, at least some of the components of the apparatus for diagnosing a positive electrode contactor of a battery pack P according to the present disclosure may be implemented by supplementing or adding the function of a component included in a conventional battery pack P. For example, the diagnosing unit 200 of the apparatus for diagnosing a positive electrode contactor of a battery pack P according to the present disclosure may be implemented by a battery management system (BMS) provided at the battery pack P.

Figure 16:
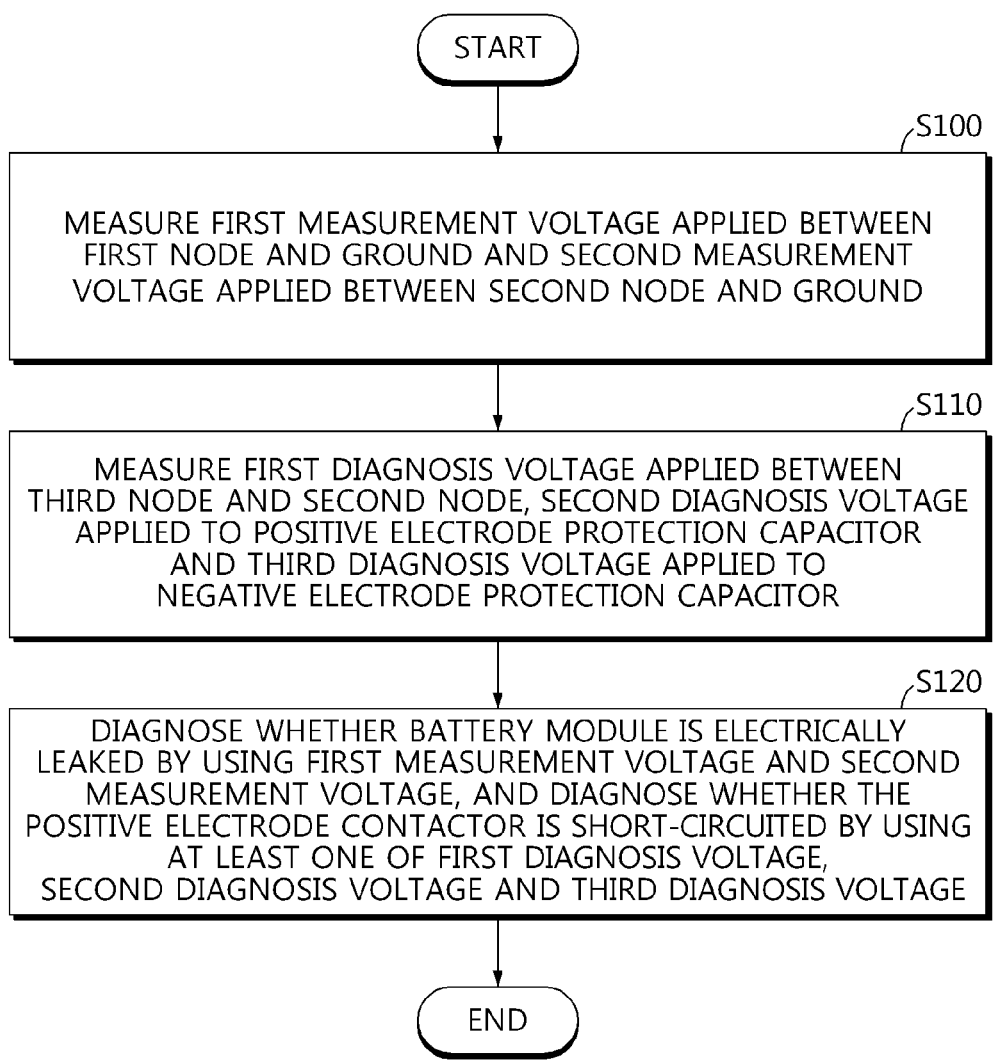
FIG. 16 is a flowchart for illustrating a method for diagnosing a positive electrode contactor of a battery pack according to an embodiment of the present disclosure.

FIG. 16 is a flowchart for illustrating a method for diagnosing a positive electrode contactor of a battery pack according to an embodiment of the present disclosure. In FIG. 16, the subject of each step may be each component of the apparatus for diagnosing a positive electrode contactor of a battery pack P according to the present disclosure as described above.

As shown in FIG. 16, the method for diagnosing a positive electrode contactor of a battery pack P according to the present disclosure includes an insulation resistance measuring step (S100), a diagnosis voltage measuring step (S110), and a short circuit diagnosing step (S120).

First, in the insulation resistance measuring step S100, the first measurement voltage applied between the ground G and the first node N1 to which the positive electrode terminal of the battery module 100 provided at the battery pack P and one end of the positive electrode contactor PC are commonly connected may be measured, and the second measurement voltage applied between the ground G and the second node N2 to which the negative electrode terminal of the battery module 100 and one end of the negative electrode contactor NC are commonly connected may be measured.

In the diagnosis voltage measuring step S110, the first diagnosis voltage applied between the second node N2 and the third node N3 located between the other end of the positive electrode contactor PC and the positive electrode terminal of the battery pack P, the second diagnosis voltage applied to the positive electrode protection capacitor C1 located between the positive electrode terminal of the battery pack P and the ground G, and the third diagnosis voltage applied to the negative electrode protection capacitor C2 located between the negative electrode terminal of the battery pack P and the ground G may be measured.

In the short circuit diagnosing step S120, it may be diagnosed whether the battery module is electrically leaky by using the first measurement voltage and the second measurement voltage, and it may be diagnosed whether the positive electrode contactor PC is short-circuited by using at least one of the first diagnosis voltage, the second diagnosis voltage and the third diagnosis voltage.

Moreover, in the short circuit diagnosing step S120, the first diagnosis voltage, the second diagnosis voltage and the third diagnosis voltage may be measured during the first switching cycle and the second switching cycle.

Further, in the short circuit diagnosing step S120, if the first diagnosis voltage has a positive value and the absolute value of the first diagnosis voltage gradually decreases during the first switching cycle and also if the first diagnosis voltage has a negative value and the absolute value of the first diagnosis voltage decreases gradually during the second switching cycle, it may be determined that the positive electrode contactor PC is in the normal state without the short circuit.

Moreover, in the short circuit diagnosing step S120, if the first diagnosis voltage has a positive value and is kept constant during the first switching cycle and the second switching cycle, it may be determined that the positive electrode contactor PC is in the fault state due to the short circuit.

Further, in the short circuit diagnosis step S120, if the second diagnosis voltage has a value of 0 or more and the difference between the voltage value of the second diagnosis voltage and the voltage value of the third diagnosis voltage gradually decreases during the first switching cycle and the second switching cycle, it may be determined that the positive electrode contactor PC is in the fault state due to the short circuit.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, in this specification, the terms 'unit' and 'part' are used, such as 'measuring unit', 'diagnosing unit' and 'control unit'. However, it will be apparent to those skilled in the art that these terms just represent logical configuration units and are not intended to represent components that are physically separable or must be physically separated.

What is claimed is:

1. An apparatus for diagnosing a positive electrode contactor of a battery pack, wherein the battery pack includes the positive electrode contactor provided on a charge-discharge path connected to a positive electrode terminal of the battery pack and a negative electrode contactor provided on a second charge-discharge path connected to a negative electrode terminal of the battery pack, the apparatus configured to:
   measure a first measurement voltage applied between a ground and a first node to which a positive electrode terminal of a battery module included in the battery pack and a first end of the positive electrode contactor are both connected; and
   measure a second measurement voltage applied between the ground and a second node to which a negative electrode terminal of the battery module and a first end of the negative electrode contactor are both connected, the apparatus comprising;
   a positive electrode protection capacitor located between the ground and the positive electrode terminal of the battery pack;
   a negative electrode protection capacitor located between the ground and the negative electrode terminal of the battery pack; and
   a processor coupled to a plurality of diagnosis circuits configured to selectively connect two of the first node, the second node, a third node to which a second end of the positive electrode contactor and a first end of the positive electrode protection capacitor are both connected, a fourth node to which a second end of the negative electrode contactor and a first end of the negative electrode protection capacitor are both connected, and the ground,
   wherein the processor is configured to:
   measure a first diagnosis voltage applied between the third node and the second node,
   measure a second diagnosis voltage applied to the positive electrode protection capacitor;
   measure a third diagnosis voltage applied to the negative electrode protection capacitor;
   diagnose whether the battery module is electrically leaky based on the first measurement voltage and the second measurement voltage, and
   diagnose whether the positive electrode contactor is short-circuited based on at least one of the first diagnosis voltage, the second diagnosis voltage or the third diagnosis voltage.

2. The apparatus for diagnosing a positive electrode contactor of a battery pack according to claim 1, wherein the plurality of diagnosis circuits comprises:
   a first diagnosis circuit connected between the third node and the second node and configured to measure the first diagnosis voltage between the third node and the second node;
   a second diagnosis circuit connected between the third node and the ground and configured to measure the second diagnosis voltage between the third node and the ground; and
   a third diagnosis circuit connected between the fourth node and the ground and configured to measure the third diagnosis voltage between the fourth node and the ground.

3. The apparatus for diagnosing a positive electrode contactor of a battery pack according to claim 2,
   wherein the first diagnosis circuit includes a first voltage dividing circuit having a first protection resistor and a first detection resistor to divide the first diagnosis voltage and a first switch for applying a voltage to the first voltage dividing circuit in response to a first control signal output from the processor,
   wherein the second diagnosis circuit includes a second voltage dividing circuit having a second protection resistor and a second detection resistor to divide the second diagnosis voltage and a second switch for applying a voltage to the second voltage dividing circuit in response to a second control signal output from the processor, and
   wherein the third diagnosis circuit includes a third voltage dividing circuit having a third protection resistor and a third detection resistor to divide the third diagnosis voltage and a third switch for applying a voltage to the third voltage dividing circuit in response to a third control signal output from the processor.

4. The apparatus for diagnosing a positive electrode contactor of a battery pack according to claim 3,
   wherein the first voltage measuring unit includes a fourth voltage dividing circuit having a fourth protection resistor and a fourth detection resistor to divide the first measurement voltage and a fourth switch for applying a voltage to the fourth voltage dividing circuit in response to a fourth control signal output from the processor, and
   wherein the second voltage measuring unit includes a fifth voltage dividing circuit having a fifth protection resistor and a fifth detection resistor to divide the second measurement voltage and a fifth switch for applying a voltage to the fifth voltage dividing circuit in response to a fifth control signal output from the processor.

5. The apparatus for diagnosing a positive electrode contactor of a battery pack according to claim 4,
wherein the processor is configured to:
control the fourth switch and the first switch into a closed state during a first switching cycle,
control the fifth switch into an open state during the first switching cycle,
control the fourth switch into an open state during a second switching cycle,
control the fifth switch and the first switch into a closed state during the second switching cycle, and
measure the first diagnosis voltage, the second diagnosis voltage and the third diagnosis voltage during each of the first switching cycle and the second switching cycle.

6. The apparatus for diagnosing a positive electrode contactor of a battery pack according to claim 5,
wherein the processor is configured to determine that the positive electrode contactor is in a normal state without a short circuit when the first diagnosis voltage has a positive value during the first switching cycle, an absolute value of the first diagnosis voltage gradually decreases during the first switching cycle, the first diagnosis voltage has a negative value during the second switching cycle, and an absolute value of the first diagnosis voltage gradually decreases during the second switching cycle.

7. The apparatus for diagnosing a positive electrode contactor of a battery pack according to claim 5,
wherein the processor is configured to determine that the positive electrode contactor is in a fault state with a short circuit when the first diagnosis voltage has a positive value and is kept constantly during each of the first switching cycle and the second switching cycle.

8. The apparatus for diagnosing a positive electrode contactor of a battery pack according to claim 7,
wherein the processor is configured to determine that the positive electrode contactor is in the fault state with the short circuit when the second diagnosis voltage has a value of 0 or more and when a difference between a voltage value of the second diagnosis voltage and a voltage value of the third diagnosis voltage gradually decreases during each of the first switching cycle and the second switching cycle.

9. A battery pack, comprising an apparatus for diagnosing a positive electrode contactor of a battery pack according to claim 1.

10. A method for diagnosing a positive electrode contactor of a battery pack, wherein the battery pack includes the positive electrode contactor provided on a first charge-discharge path connected to a positive electrode terminal of the battery pack and a negative electrode contactor provided on a second charge-discharge path connected to a negative electrode terminal of the battery pack, the method comprising:
measuring a first measurement voltage applied between a ground and a first node to which a positive electrode terminal of a battery module included in the battery pack and a first end of the positive electrode contactor are both connected;
measuring a second measurement voltage applied between the ground and a second node to which a negative electrode terminal of the battery module and a first end of the negative electrode contactor are both connected;
measuring a first diagnosis voltage applied between the second node and a third node to which a second end of the positive electrode contactor and a first end of a positive electrode protection capacitor are both connected;
measuring a second diagnosis voltage applied to the positive electrode protection capacitor located between the ground and the positive electrode terminal of the battery pack;
measuring a third diagnosis voltage applied to a negative electrode protection capacitor located between the ground and the negative electrode terminal of the battery pack;
diagnosing whether the battery module is electrically leaky based on the first measurement voltage and the second measurement voltage;
diagnosing whether the positive electrode contactor is short-circuited based on at least one of the first diagnosis voltage, the second diagnosis voltage or the third diagnosis voltage.

* * * * *